United States Patent
Kuzumoto et al.

(12)
(10) Patent No.: US 6,616,773 B1
(45) Date of Patent: Sep. 9, 2003

(54) SUBSTRATE TREATMENT METHOD

(75) Inventors: Masaki Kuzumoto, Tokyo (JP); Seiji Noda, Tokyo (JP); Izumi Oya, Tokyo (JP); Makoto Miyamoto, Tokyo (JP); Hideo Horibe, Tokyo (JP); Tatsuo Kataoka, Shizuoka (JP); Tetsuji Oishi, Shizuoka (JP)

(73) Assignees: Mitsubishi Denki Kabushiki Kaisha, Tokyo (JP); SPC Electronics Corporation, Tokyo (JP)

( * ) Notice: Subject to any disclaimer, the term of this patent is extended or adjusted under 35 U.S.C. 154(b) by 0 days.

(21) Appl. No.: 09/686,061

(22) Filed: Oct. 11, 2000

(30) Foreign Application Priority Data

Mar. 12, 1999 (JP) ............................................. 11-344833
Apr. 19, 2000 (JP) ...................................... 2000-118433

(51) Int. Cl.⁷ ................................................ B08B 3/00
(52) U.S. Cl. .............................. 134/26; 134/1.3; 134/2; 134/3; 134/31; 134/37; 216/57; 216/83; 216/94
(58) Field of Search ............................. 134/1.3, 31, 37, 134/26, 3, 2; 216/57, 94, 83; 156/662.1, 643.1

(56) References Cited

U.S. PATENT DOCUMENTS 5,049,320 A * 9/1991 Wang et al. .............. 261/122.1
5,464,480 A * 11/1995 Matthews et al. ........... 134/1.3

2002/0011257 A1 * 1/2002 DeGendt et al.

FOREIGN PATENT DOCUMENTS

| JP | 1-239933 | 9/1989 |
| JP | 5-152270 | 6/1993 |
| JP | 411219926 A | * 8/1999 |

OTHER PUBLICATIONS

De Gendt, et al., Solid State Technology, p. 57, Dec. 1998.*
DeGendt et al. 1998 Symposium on VLSI Technology, Digest of Technical Papers, 1998, p. 168.*
Managing Disease In Recycling Irrigation Systems,.*
Reference and Application Data—Humidity Sensors.*
DoChem 065 The effect of Temperature on Solubility.*
Antarctic Explorers.*

* cited by examiner

Primary Examiner—Randy Gulakowski
Assistant Examiner—Gentle E. Winter
(74) Attorney, Agent, or Firm—Leydig, Voit & Mayer, Ltd.

(57) ABSTRACT

A substrate treatment assembly for treating a work object on a surface of a substrate by supplying to the work object a wet ozone-containing gas wetted with a treatment solution includes a substrate heating device for maintaining a substrate at a temperature higher than room temperature, a wetting device for producing a wet ozone-containing gas by wetting an ozone-containing gas with a treatment solution, a supply device for supplying the wet ozone-containing gas to a work object on a surface of the substrate, a gas conduit connecting the wetting device to the supply device, and a heating device for heating the wet ozone-containing gas to a temperature approximately equal to or greater than the temperature of the substrate.

12 Claims, 19 Drawing Sheets

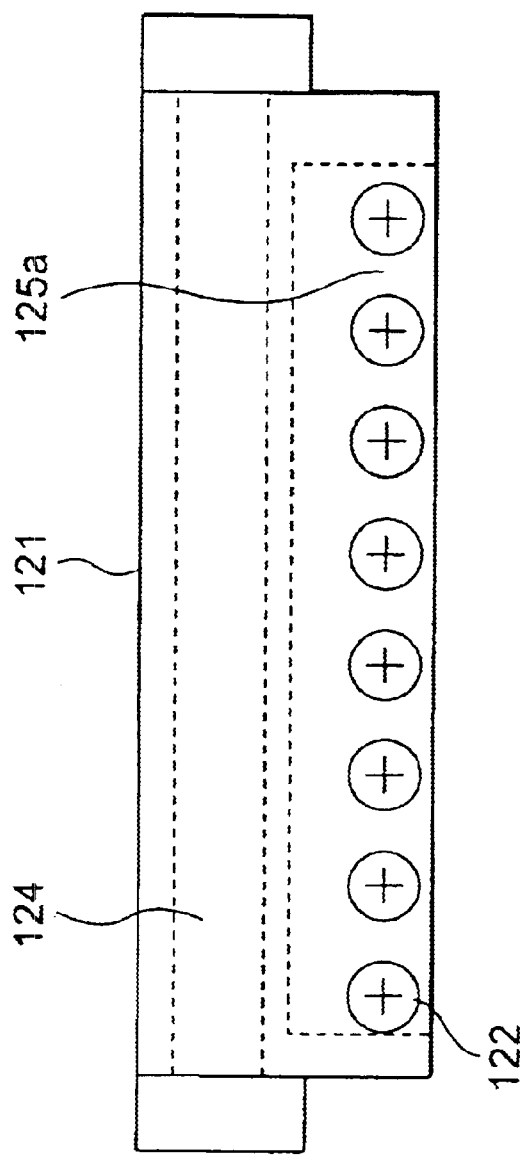
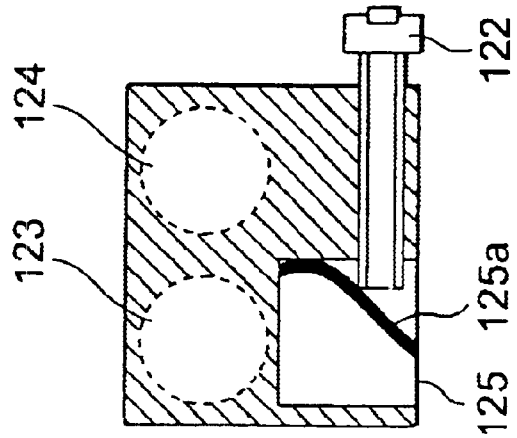

RESIST REMOVAL

PRE-TREATMENT CLEANING

SUBSTRATE TREATMENT METHOD

BACKGROUND OF THE INVENTION

1. Field of the Invention

The present invention relates to a substrate treatment method and assembly, for example, for removing work objects such as photoresist film or deposits of unwanted organic or inorganic compounds in micromachining processes which include manufacturing processes for semiconductors such as integrated circuits (ICs), large-scale integrations (LSIs), liquid crystal displays (LCDs), printed circuit boards, etc.

2. Description of the Related Art

In micromachining processes for manufacturing processes for semiconductor devices such as ICs, LSIs, etc., photosensitive organic macromolecular compounds are applied to a semiconductor substrate of silicon or the like, or to a glass substrate, a photoresist is developed after exposing the substrate to ultraviolet light through a photomask formed with a predetermined pattern for a circuit, etc., to form a photoresist pattern on the substrate, a film may be formed by chemical vapor deposition (CVD), sputtering, etc., on the portions of the substrate where the photoresist pattern has not been formed, and etching by chemicals, reactive ion etching (RIE), heat diffusion of impurities, and ion implantation may be performed. Then, the film of photoresist remaining on the substrate after this series of treatments is removed by chemical treatment, but in manufacturing processes for LSIs, etc., this operation of applying photoresist and removing the photoresist film after performing a variety of treatments is generally carried out not just once, but several times.

Several methods have been adopted for removing the photoresist film, but since the photoresist film can adversely affect subsequent processes if not completely removed, it is important to ensure that the photoresist film is removed completely. In particular, as the line width of circuitry being formed on semiconductor devices gets finer and finer with the rising the degree of integration that is occurring nowadays, because effects of photoresist film residue are more of a problem than when integration was lower, complete removal is called for, and this is normally attempted by means of wet processes using a chemical solutions or dry processes using oxygen plasmas or the like.

In photoresist film removal by wet processes, sulfuric acid is normally used and hydrogen peroxide is added to raise the oxidizing capacity of the sulfuric acid. Similarly, in LCD manufacturing processes, special solutions such as 106 solution (30% dimethyl sulfoxide, 70% monoethanolamine) are used. In smear removal from printed circuit boards, chemical solutions such as permanganic acid are used. When these solutions are used to remove the photoresist film and unwanted deposits, it is common to clean with ultrapure water to remove solution remaining after film and deposit removal, and to further remove residue and other deposits.

However, with these methods, it is necessary to use large amounts of chemical solutions which are expensive and have a large environmental impact, and the development of alternative treatment methods is an urgent task. Thus, methods for removing unwanted deposits such as organic matter using ozone gas have been proposed as environmentally friendly substrate treatment methods. Of these, the substrate treatment method disclosed in Japanese Patent Laid-Open No. HEI 5-152270 is an extremely promising method enabling significant improvement in removal speed. This method increases removal speed using wet ozone gas. The construction of the assembly is shown in FIG. 27.

In the drawing, a substrate 2 is placed on a substrate mounting table 3 disposed in a treatment chamber 1, a discharge pipe 13 for discharging gas from the treatment chamber 1 is disposed in the treatment chamber 1, and an ozone decomposition device 40 is connected to the discharge pipe 13. Before treatment with an ozone-containing gas, the inside of the treatment chamber 1 is sealed and gas in the treatment chamber 1 is removed by suction through the discharge pipe 13. The substrate mounting table 3 is mounted on a rotatable shaft and is constructed such that the substrate 2 is rotated as it is being treated with the ozone-containing gas to ensure uniform treatment.

Oxygen is supplied from an oxygen storage tank 43 to an ozone gas generator 6 and the ozone-containing gas generated in the ozone gas generator 6 comes into contact with ultrapure water in a gas-liquid contact device 7, becomes wet, is supplied to the treatment chamber 1 through an ozone-containing gas supply pipe 8, passes through apertures 24 disposed in a gas disperser 5, and acts on work objects on the substrate 2. The gas disperser 5 is composed of quartz, fluorocarbon resin, or the like, and is formed from a perforated plate or a porous sintered body through which gas can pass to enable the ozone-containing gas to be supplied to the surface of the substrate 2 uniformly.

Ozone in the gas discharged from the treatment chamber 1 is broken down by the ozone decomposition device 40 and discharged. An ultrapure water supply nozzle 25 for cleaning the substrate 2 is disposed in the treatment chamber 1 and the surface of the substrate 2 is cleaned with ultrapure water on completion of the treatment. After the treatment is completed, gas remaining inside the treatment chamber 1 is replaced with a gas such as nitrogen, and the substrate 2 is removed from the treatment chamber 1 and dried. Because wet ozone, which is extremely reactive, is supplied to the inside of the treatment chamber 1, inner surfaces of the treatment chamber 1 and surfaces of the devices inside the treatment chamber 1 are composed of quartz, fluorocarbon resin or the like.

Japanese Patent Laid-Open No. HEI 5-152270 states that the speed of photoresist film removal is significantly improved by the use of wet ozone and that removal speeds of approximately 0.2 μm/min were achieved by the substrate treatment method disclosed therein even at room temperature. However, by comparison, the removal speed when using conventional mixed sulfuric acid-hydrogen peroxide-water solutions or the special 106 solution is 1 μm/min or more, making further improvement of removal speed a necessary and indispensable condition to make the above substrate treatment method using wet ozone-containing gas practical, and to date there have been no examples of its actual use.

Generally, the speed of a chemical reaction increases as temperature rises. Consequently, measures which try to achieve practical removal speeds by raising the temperature of the substrate are conceivable. However, as disclosed in paragraph 0017 of Japanese Patent Laid-Open No. HEI 5-152270, it was not possible to speed up the removal speed by the above conventional method in which wet ozone-containing gas was supplied, even when the substrate was heated.

SUMMARY OF THE INVENTION

The present invention aims to solve the above problems and an object of the present invention is to provide a method and assembly for treating substrates enabling significant improvement to removal treatment speed by controlling a ratio between the amount of ozone and the amount of vapor in the wet ozone-containing gas supplied to the substrate.

In order to achieve the above object, according to one aspect of the present invention, there is provided a substrate treatment method including a wet ozone-containing gas treatment process for treating a work object on a surface of a substrate by supplying to the work object a wet ozone-containing gas wetted with a treatment solution, the wet ozone-containing gas contains more vapor of the treatment solution than a saturation vapor level occurring at a given temperature of the substrate.

The wet ozone-containing gas treatment process may include:

maintaining the substrate at a temperature higher than room temperature; and controlling the wet ozone-containing gas so as to be at a temperature approximately equal to or greater than the temperature of the substrate.

The temperature of the wet ozone-containing gas may be controlled so as to be between 5° C. and 15° C. higher than the temperature of the substrate.

A cleaning process may be included after the wet ozone-containing gas treatment process, the cleaning process including cleaning the substrate with a cleaning solution containing at least one organic solvent chosen from a group including pure water, acidic aqueous solutions, alkaline aqueous solutions, ketones, and alcohols.

The cleaning solution may be at a temperature higher than room temperature.

The wet ozone-containing gas treatment process and the cleaning process may be repeated a number of times.

A pretreatment process may also be included before the wet ozone-containing gas treatment process, the pretreatment process including irradiating the work object on the surface of the substrate with ultraviolet light having a wavelength of 300 nm or more.

The wet ozone-containing gas may be irradiated with ultraviolet light having a wavelength in a vicinity of 250 nm during the wet ozone-containing gas treatment process.

The wet ozone-containing gas treatment process may include reducing the amount of vapor supplied to the work object on the surface of the substrate by the wet ozone-containing gas as treatment time elapses.

The wet ozone-containing gas treatment process may include reducing the amount of vapor supplied to the work object on the surface of the substrate by the wet ozone-containing gas by raising the temperature of the substrate as treatment time elapses.

The wet ozone-containing gas treatment process may be performed in a number of treatment tanks and may include setting the temperature of the substrate so as to be progressively higher in each successive treatment tank.

The wet ozone-containing gas treatment process may include reducing the amount of vapor supplied to the work object on the surface of the substrate by the wet ozone-containing gas by lowering the temperature of the wet ozone-containing gas as treatment time elapses.

The wet ozone-containing gas treatment process may be performed in a number of treatment tanks and may include setting the temperature of the wet ozone-containing gas so as to be progressively lower in each successive treatment tank.

According to yet another aspect of the present invention, there is provided a substrate treatment assembly including:

a substrate heating device for maintaining a substrate at a temperature higher than room temperature;

a wetting device for obtaining a wet ozone-containing gas by wetting an ozone-containing gas with a treatment solution;

a supply device for supplying the wet ozone-containing gas to a work object on a surface of the substrate;

a gas conduit connecting the wetting device to the supply device; and a wet ozone-containing gas heating device for heating the wet ozone-containing gas so as to be at a temperature approximately equal to or greater than the temperature of the substrate.

The supply device may include a gas disperser including a number of aperture aligned in a number of rows in a width direction of the work object, the disperser being constructed such that apertures in adjacent rows do not align with each other in a direction perpendicular to the rows, the supply device being constructed such that at least the gas disperser or the substrate is movable in a direction perpendicular to the rows.

Spacing between adjacent rows of apertures in the gas disperser may be 5 mm or more.

According to yet another aspect of the present invention, there is provided a substrate treatment assembly for supplying an ozone-containing gas and a treatment solution to a work object on a surface of a substrate through a treatment agent supply plate disposed facing the work object, in which spacing between a surface of the work object and the treatment agent supply plate is between 0.1 mm and 1.0 mm.

BRIEF DESCRIPTION OF THE DRAWINGS

FIG. 10A is a cross section explaining a construction of a wet ozone-containing gas spray nozzle according to Embodiment 6 of the present invention;

FIG. 10B is an end elevation explaining a construction of a wet ozone-containing gas spray nozzle according to Embodiment 6 of the present invention;

DETAILED DESCRIPTION OF THE PREFERRED EMBODIMENTS

Embodiment 1

Figure 1:
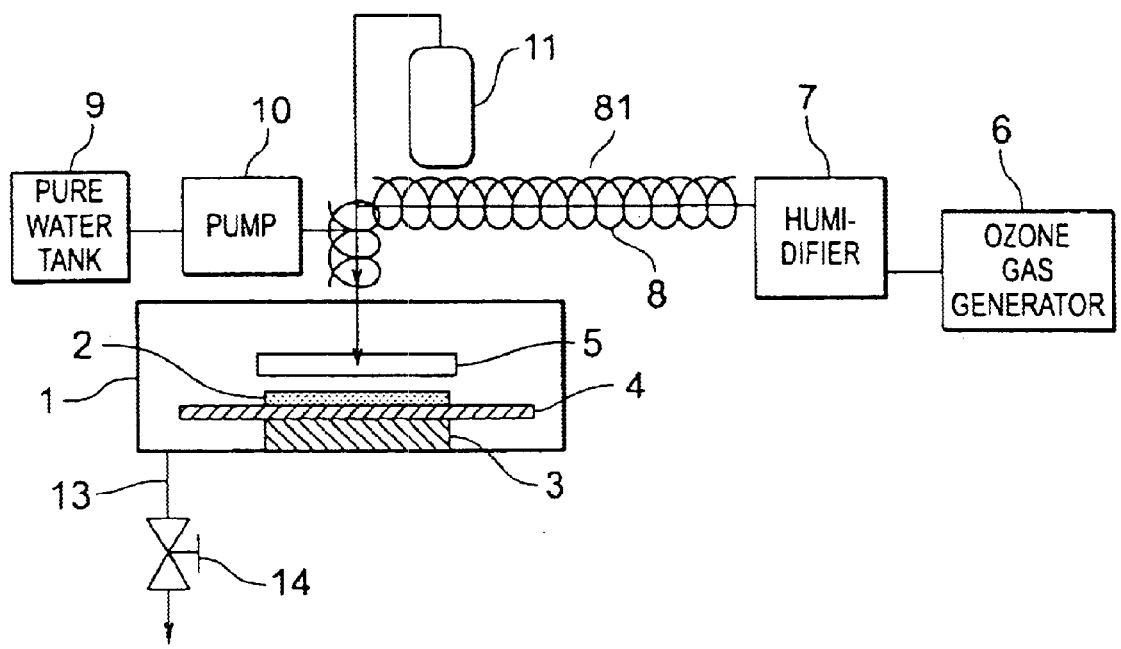
FIG. 1 is a diagram schematically showing a construction of the substrate treatment assembly according to Embodiment 1 of the present invention.

FIG. 1 is a block diagram schematically showing a construction of the substrate treatment assembly according to Embodiment 1 of the present invention. A substrate 2 housed in a treatment chamber 1 is placed on a flat-plate heater 4 attached to a base table 3. A header 5 is disposed above the substrate 2, the header 5 controlling a flow of wet ozone-containing gas and supplying a wet ozone-containing gas uniformly to a work surface on the substrate 2, and although not shown, a wet ozone-containing gas heating mechanism is disposed in the header 5, the wet ozone-containing gas heating mechanism being an electric heater or the like, or a hot water heater, etc. Also provided are: an ozone gas generator 6 for generating an ozone-containing gas; a humidifier 7 for humidifying the ozone-containing gas; a gas conduit 8 for conducting the humidified ozone-containing gas; a ribbon heater 81 for heating the gas conduit 8; a pure water tank 9 for cleaning the substrate 2 after ozone treatment; a pump 10 for conveying water; a gas discharge pipe for discharging the ozone-containing gas; and a flow adjustment valve 14 for adjusting the amount of gas discharged. The humidifier 7 has a construction such as that shown in FIG. 7B, for example, in which the ozone-containing gas is bubbled through a treatment solution 26 held in a bubbling bottle 20, and includes a mechanism for heating the treatment solution 26. Moreover, highly ozone-resistant materials such as quartz glass or fluorocarbon resin, for example, are used in all portions of components directly exposed to the ozone-containing gas. Furthermore, although not shown, an ozone decomposition device is connected to the gas discharge pipe 13.

The first step in this substrate treatment method is to heat the substrate 2 to a predetermined temperature using the flat-plate heater 4. The treatment solution 26 in the humidifier 7, the gas conduit 8, and the header 5 are also preheated and stabilized at a temperature above the set value for the substrate 2. When the temperature of the substrate 2 has stabilized, the ozone-containing gas is passed through the humidifier 7, and the resulting moisture-laden wet ozone-containing gas is supplied to work objects on the surface of the substrate 2 (hereinafter simply "the surface of the substrate" or "the substrate"). Here, as will be explained below, as the ozone-containing gas passes through the humidifier 7, the moisture content thereof is made to correspond to the saturated vapor level at that temperature by adjusting the contact time between the ozone-containing gas and the treatment solution. After the work objects have been decomposed by treatment for a predetermined length of time, supply of the wet ozone-containing gas is stopped and the surface of the substrate 2 is washed using the pump 10 and the pure water tank 9 to remove decomposition products. Then, nitrogen gas is supplied from a nitrogen cylinder 11 to dry the substrate 2.

Next, Embodiment 1 will be explained in further detail based on concrete inventive examples.

Inventive Example 1

First, Inventive Example 1 will be explained. A photoresist film having a thickness of approximately 1550 nm was formed as a work object by applying a positive photoresist (TFR-B, manufactured by Tokyo Ohka Kogyo, Co., Ltd.) to a surface-cleaned substrate 2 (a glass substrate pre-coated with a 400 nm chrome film) using a spin coater and post-baking for three minutes at 120° C. The 10 cm×10 cm photoresist film on the substrate 2 was placed on the flat-plate heater 4 inside the treatment chamber 1 facing upwards in FIG. 1 and heated to 68° C. The gas conduit 8 and the header 5 were heated to 80° C., and when their respective temperatures had stabilized, wet ozone-containing gas (ozone concentration: 200 g/Nm) humidified in the humidifier 7 by being passed through pure water heated to 80° C. was supplied at a rate of 1.25 l/min. The humidity in the wet ozone-containing gas was adjusted to saturated vapor level at 80° C.

After one minute of substrate treatment with the wet ozone-containing gas (hereinafter "ozone treatment"), 80° C. pure water was supplied to the substrate at a rate of 300 ml/min to remove decomposed photoresist. Photoresist film removal speed was tested under similar conditions while varying the temperature of the substrate 2 to 62° C., 72° C.; 78° C., and 82° C.

Figure 2:
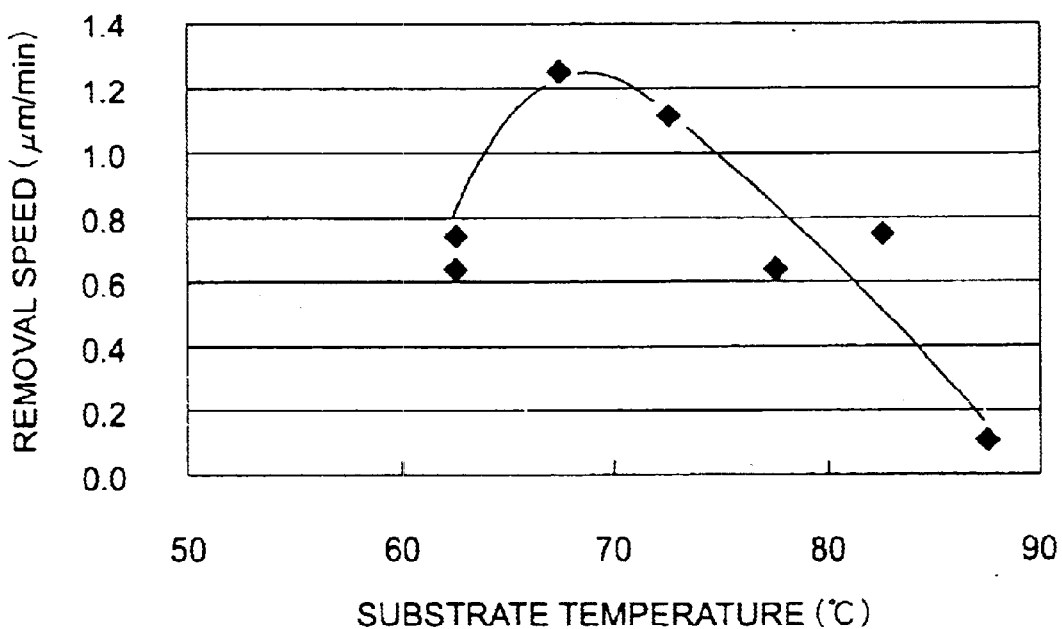
FIG. 2 relates to Embodiment 1 of the present invention and is a graph explaining a relationship between substrate temperature and stripping speed at a wet ozone-containing gas temperature of 80° C.

The results of Inventive Example 1 are shown in FIG. 2. As can be seen from FIG. 2, at a substrate temperature of 68° C., the fastest removal speed 1.25 $\mu$m/min was obtained when the temperature of the wet ozone-containing gas was 80° C., which is 12° C. lower than the temperature of the wet ozone-containing gas. The removal speed was several times faster than the conventional method disclosed in Japanese Patent Laid-Open No. HEI 5-152270 which was 0.2 $\mu$m/min. Much faster removal speeds than the conventional method were obtained when the substrate temperature was within a range of 62° C. to 82° C.

This inventive example proves that photoresist film removal speed can be increased by maintaining the substrate 2 at a temperature higher than room temperature and controlling the temperature of the wet ozone-containing gas supplied to the substrate 2 work surface, i.e., the photoresist film, so as to be approximately equal to or greater than the temperature of the substrate 2.

In particular, as can be seen from FIG. 2, the fact that the fastest removal speed 1.25 $\mu$m/min was obtained at a substrate temperature of 68° C. which is 12° C. lower than the temperature of the wet ozone-containing gas proves that the photoresist film removal speed can be increased when the wet ozone-containing gas contains more vapor than the saturated vapor level at the substrate temperature.

Inventive Example 2

Next, Inventive Example 2 will be explained. Inventive Example 2 was the same as Inventive Example 1 above, except that the temperature of the wet ozone-containing gas was set at 95° C. As in Inventive Example 1, the relationship between substrate temperature and removal speed was also tested in Inventive Example 2. The results of Inventive Example 2 are shown in Table 1. As can be seen from Table 1, the fastest removal speed 1.36 $\mu$m/min was obtained at a substrate temperature of 86° C. which is 9° C. lower than the temperature of the wet ozone-containing gas.

TABLE 1

| Substrate temperature (° C.) | Removal speed ($\mu$m/min) |
| --- | --- |
| 66 | 0.59 |
| 76 | 0.61 |
| 86 | 1.36 |
| 91 | 1.12 |

The results from Inventive Examples 1 and 2 above not only provided an actual increase in removal speed but also led to an extremely important discovery, namely that an optimum substrate temperature for removal treatment exists relative to the temperature of the wet ozone-containing gas, and that the substrate temperature providing the fastest removal speed is approximately 10° C. below the temperature of the wet ozone-containing gas. According to thermochemical reaction theory removal speed should increase as the substrate temperature rises, but an optimum temperature difference existed in the case of Inventive Examples 1 and 2. This phenomenon will be explained in detail below.

A photoresist film removal process utilizing the temperature difference between the substrate 2 and the wet ozone-containing gas will now be explained in detail. When ozone gas alone is supplied to the substrate 2, removal speed is extremely slow because it is necessary to oxidize components of the photoresist into extremely small gaseous molecules such as carbon dioxide, water vapor and the like. By contrast, methods in which the photoresist film is broken down to a certain extent into smaller molecules using ozone molecules and washed away using water have been considered the best until now. These methods include, for example, ozone and water treatment methods in which ozone molecules are forcefully dissolved into water, or methods in which ozone gas and water are alternately made to act on the work surface of a rotating substrate and the thickness of a water film on the substrate is controlled by rotation.

However, these methods did not improve removal speed as much as expected. Then the present inventors discovered that both ozone molecules and water molecules were required for oxidation of the photoresist in the reaction mechanism between the ozone and the photoresist. It was found to be extremely important that neither the ozone nor the water be present in great excess and that both be supplied to the photoresist in a uniformly mixed system. This mechanism was not described in Japanese Patent Laid-Open No. HEI 5-152270, but the photoresist removal method using wet ozone described in that Patent Laid-Open was an extremely reasonable and valid method for delivering a suitable amount of moisture to the reaction.

Generally, the reaction speed of a chemical reaction increases as the temperature rises, but it is clear that with the wet ozone supply method disclosed in Japanese Patent Laid-Open No. HEI 5-152270 the photoresist removal speed would not be improved even if the substrate temperature were raised, and the present inventors have confirmed a similar phenomenon. The present inventors discovered that this inability in the method disclosed in Japanese Patent Laid-Open No. HEI 5-152270 is due to the following causes: (1) a larger amount of moisture is required to start the reaction quickly at high temperatures than at room temperature; and (2) sufficient humidity cannot be supplied to a high-temperature substrate using ozone gas bubbled through room temperature water. It was this discovery that pointed to a new moisture supply method utilizing water condensation phenomena. If the substrate temperature is set to a temperature lower than that of the high-temperature wet ozone-containing gas, moisture in the wet ozone-containing gas adheres to the surface of the substrate due to condensation. However, it is necessary to set this temperature difference according to appropriate conditions, as will be explained using FIG. 3. In FIG. 3, 15 is an ozone molecule, 16 is a water molecule, and 17 is a photoresist molecule.

(1) When the temperature of the wet ozone-containing gas is too high compared to the temperature of the substrate.

Figure 3A:
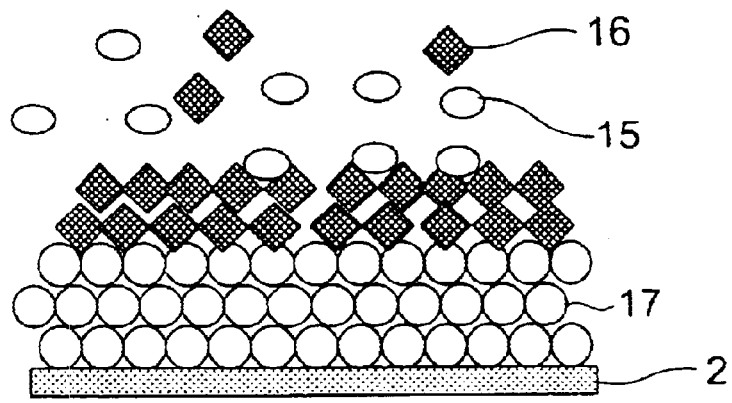
FIG. 3A relates to Embodiment 1 of the present invention and is a diagram explaining a photoresist stripping mechanism when the temperature of the wet ozone-containing gas is too high compared to the temperature of the substrate.

Specifically, in FIG. 2, this corresponds to when the temperature of the substrate 2 is less than 62° C. and is less than the temperature of the wet ozone-containing gas, and the temperature difference between the wet ozone-containing gas and the substrate is 18° C. or more. In that case, as shown in FIG. 3A, too many water molecules 16 condense on top of the photoresist molecules 17, the entire surface of the film of photoresist molecules 17 becomes covered in a water film, and ozone molecules 15 are blocked by this water film from reaching the photoresist molecules 17, making oxidation of the photoresist molecules 17 difficult.

(2) When the temperature of the wet ozone-containing gas is too low compared to the temperature of the substrate.

Figure 3B:
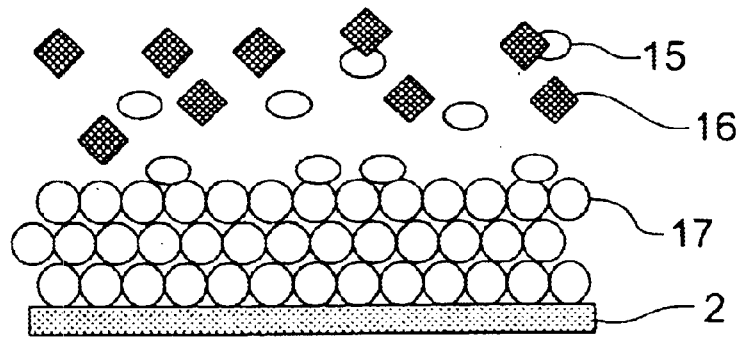
FIG. 3B relates to Embodiment 1 of the present invention and is a diagram explaining a photoresist stripping mechanism when the temperature of the wet ozone-containing gas is too low compared to the temperature of the substrate.

Specifically, in FIG. 2, this corresponds to when the temperature of the substrate 2 is greater than 82° C. and is greater than the temperature of the wet ozone-containing gas. In that case, as shown in FIG. 3B, water molecules 16 cannot condense anywhere on the surface of the film of photoresist molecules 17. As a result, only ozone molecules 15 are supplied to the substrate 2 which is at best equivalent to dry ozone treatment. Consequently, oxidation of the photoresist molecules 17 becomes difficult.

(3) When the temperature difference between the wet ozone-containing gas and the substrate is appropriate.

Figure 3C:
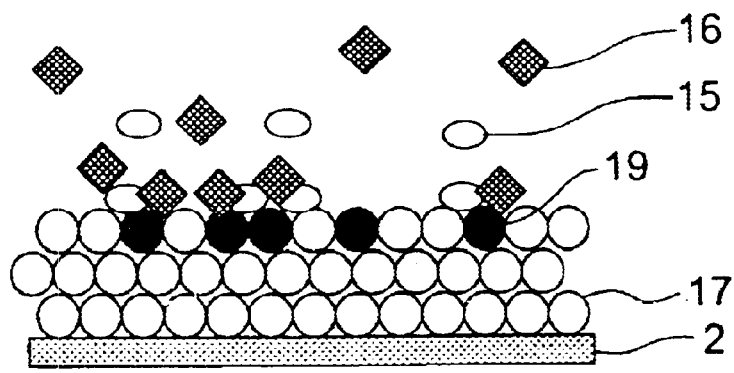
FIG. 3C relates to Embodiment 1 of the present invention and is a diagram explaining a photoresist stripping mechanism when the temperature difference between the wet ozone-containing gas and the substrate is appropriate.

Specifically, in FIG. 2, this corresponds to when the temperature of the substrate 2 is less than the temperature of the wet ozone-containing gas and is within a range from 65° C. to 75° C., and the temperature difference between the wet ozone-containing gas and the substrate is within a range from 5° C. to 15° C. In that case, as shown in FIG. 3C, because the rate of condensation of the water molecules 16 onto the surface of the substrate 2 is optimal and the ozone molecules 15 can also act on the entire surface of the film of photoresist molecules 17, oxidation of the photoresist molecules 17 occurs abundantly. By washing away the resulting oxidized photoresist molecules 19 with large amounts of water, it becomes possible to remove the photoresist quickly.

Moreover, in FIG. 2, although the amount of moisture is slightly high when the substrate temperature is within a range from 62° C. to 65° C. and slightly low when the substrate temperature is within a range from 75° C. to 82° C., the reaction speed can be considered to have been improved in these ranges due to the reaction temperature being higher than room temperature, the removal speed being greatly improved over Japanese Patent Laid-Open No. HEI 5-152270 and a sufficient removal speed obtained.

By clarifying how the oxidation reaction of the photoresist molecules 17 is codependent on the ozone molecules 15 and the water molecules 16 in the above manner, the present invention points to a new water (moisture) supply method based on a completely different concept from other ozone treatment methods to date, namely water supply rate control utilizing the difference between substrate temperature and wet ozone-containing gas temperature.

There is an extremely important point to consider when applying the above concept to an assembly which will now be explained. In FIG. 1, even if wet ozone-containing gas having a higher temperature than the temperature of the substrate 2 is generated in the humidifier 7, it is not possible to achieve sufficient effect if the temperature of the gas conduit 8 conducting the wet ozone-containing gas and the temperature of the header 5 for spraying the substrate 2 is lower than the temperature of the substrate 2. That is, if the temperature of the gas conduit 8 is low, vapor condenses in the gas conduit 8 and sufficient moisture cannot be supplied to the substrate 2. If the temperature of the header 5 is low, condensation occurs in a portion of the header 5, and not only is insufficient moisture supplied to the working surface of the substrate 2, but condensed water droplets may drip down onto the substrate 2. When more moisture than is necessary adheres to a portion of the substrate 2 in the form of a water droplet, the film of water formed by the water droplet becomes a barrier, ozone gas is not sufficiently supplied to the work surface of the substrate 2, and the photoresist on that portion may remain as residue. Consequently, it is essential that the temperature of the wet ozone-containing gas be maintained approximately at or above the temperature of the substrate 2 from when the ozone-containing gas is wet until the wet ozone-containing gas is sprayed onto the substrate 2. In other words, the temperature of the wet ozone-containing gas, the gas conduit 8, and the header 5 must be controlled so as to be substantially constant, and it is effective to keep the temperature approximately at or above the temperature of the substrate 2, preferably between several degrees centigrade (° C.) and ten or so degrees centigrade higher than the substrate 2, between 5° C. and 15° C. higher, for example.

Embodiment 2

Figure 4:
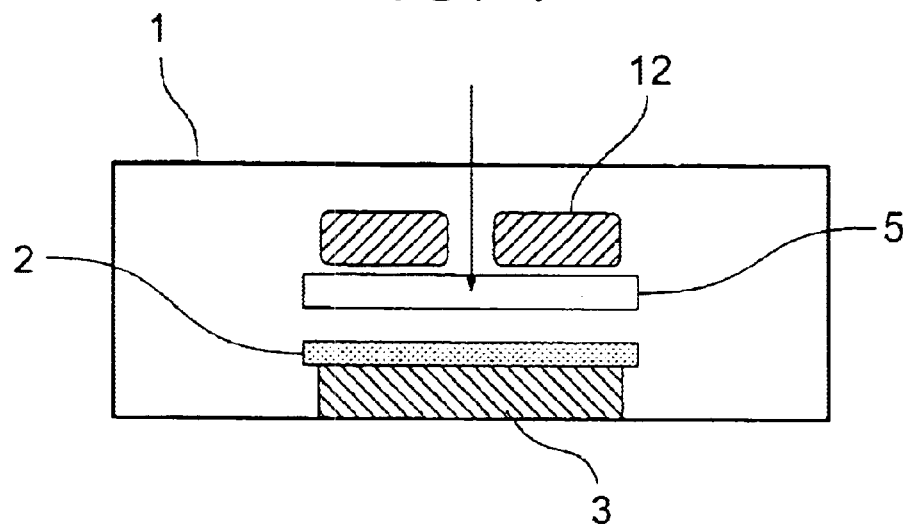
FIG. 4 is a diagram schematically showing part of a construction of the substrate treatment assembly according to Embodiment 2 of the present invention.

FIG. 4 is a diagram schematically explaining part of a construction of the substrate treatment assembly according to Embodiment 2 of the present invention. In Embodiment 2, an infrared heater 12 is disposed inside the treatment chamber 1 above the header 5 which is made of quartz glass, and the substrate 2 is heated using the infrared heater 12. The rest of the construction is the same as in FIG. 1.

Inventive Example 3

The present embodiment will be explained here using an actual inventive example. First, a photoresist film having a thickness of approximately 1550 nm was formed as a work object by applying a positive photoresist (TFR-B, manufactured by Tokyo Ohka Kogyo, Co., Ltd.) to a surface-cleaned substrate 2 (a glass substrate pre-coated with a 400 nm chrome film) using a spin coater and post-baking for three minutes at 120° C.

Next, the 10 cm×10 cm photoresist film on the substrate 2 was placed on the base table 3 inside the treatment chamber 1 facing upwards in FIG. 4 and the substrate 2 was heated to 68® C. by the infrared heater 12. The gas conduit 8 and the header 5 were heated to 80° C., and when their respective temperatures had stabilized, ozone-containing gas was humidified by being passed through pure water heated to 80° C. to generate wet ozone-containing gas (ozone concentration: 200 g/Nm$^3$). The wet ozone-containing gas was supplied at a rate of 1.25 l/min. Moreover, the humidity in the wet ozone-containing gas was adjusted to saturated vapor level at 80° C.

After one minute of ozone treatment, 80° C. pure water was supplied to the substrate at a rate of 300 ml/mim to remove decomposed photoresist. Photoresist film removal speed was tested under similar conditions while varying the temperature of the substrate 2. The treatment results for Inventive Example 3 were substantially the same as in FIG. 2.

It was also determined that the same results are obtained whether the heating of the substrate 2 is performed from above or below the substrate 2.

Embodiment 3

Figure 5:
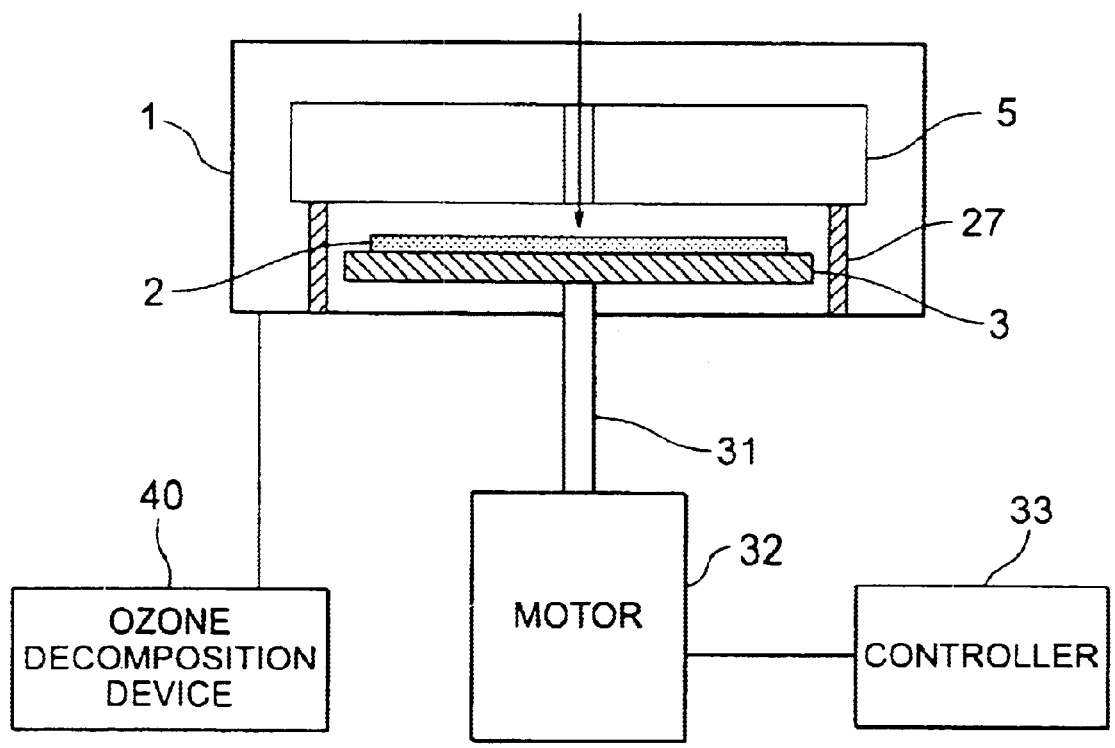
FIG. 5 is a diagram schematically showing part of a construction of the substrate treatment assembly according to Embodiment 3 of the present invention.

FIG. 5 is a diagram schematically explaining part of a construction of the substrate treatment assembly according to Embodiment 3 of the present invention. In this embodiment, the base table 3 is constructed so as to be rotated by a motor 32. In this figure, 27 is a spacer, 31 is a rotating shaft, 32 is a motor, 33 is a controller for controlling the rotation of the motor 32, and 40 is an ozone decomposition device, the rest of the construction being the same as in Embodiment 1.

In the substrate treatment method according to this embodiment, ozone-containing gas is passed through the humidifier 7 to add humidity, and the resulting ozone-containing gas is supplied to the substrate 2 for a predetermined length of time. The wet ozone-containing gas supply time is shorter than the time required to decompose the work objects completely. After a portion of the work objects has been decomposed by treatment for the predetermined length of time, supply of the wet ozone-containing gas is stopped and the surface of the substrate 2 is washed (cleaned) using the pump 10 and the pure water tank 9 to remove decomposition products. The above wet ozone-containing gas treatment process and the washing process are alternately repeated several times. Then, nitrogen gas is supplied from a nitrogen cylinder 11 to dry the substrate 2.

Thus, by dividing the wet ozone-containing gas treatment process into a number of iterations and alternately repeating the treatment process and the washing process a number of times, treatment speed can be increased compared to performing one treatment process for a long time, enabling the work surface of the substrate to be treated uniformly and quickly over the entire surface.

Moreover, the treatment speed of the above substrate treatment can of course be further improved by maintaining the substrate 2 at a temperature which is higher than room temperature and controlling the temperature of the wet ozone-containing gas supplied to the work surface of the substrate 2 at or above the temperature of the substrate 2 as explained in Embodiments 1 and 2.

Furthermore, this embodiment can also be applied to a substrate treatment assembly of the type in which the substrate is not rotated such as those shown in FIGS. 1 and 4, and the same effects can of course be achieved.

Next, an inventive example for testing the effects according to Embodiment 3 will be explained.

Inventive Example 4

First, a photoresist film having a thickness of approximately 1550 nm was formed as a work object by applying a positive photoresist (TFR-B, manufactured by Tokyo Ohka Kogyo, Co., Ltd.) to a surface-cleaned substrate 2 (a glass substrate pre-coated with a 400 nm chrome film) using a spin coater and post-baking for three minutes at 120° C.

Next, the substrate 2 on which the photoresist film was formed was secured to the base table 3 as shown in FIG. 5, and rotated at frequency of 250 rpm. Ozone-containing gas set at a concentration of approximately 170 g/Nm$^3$ and a flow rate of 3 l/min was made to contain approximately 2.7% moisture by the humidifier 7. The humidifier 7 in this inventive example was a bottle containing pure water, and moisture was added to the ozone-containing gas by bubbling the ozone-containing gas once through the pure water. The distance between the substrate 2 and the header 5 was set at 2.3 mm by the spacer 27. The ozone treatment was performed by supplying the wet ozone-containing gas through the header 5 to the substrate 2 for 15 seconds, then washing (cleaning) was performed by supplying pure water at 4 ml/sec for 10 seconds using the pump 10. The supply time for the wet ozone-containing gas was varied to 30 sec. 1 min, 3 min, and 5 min under the same conditions and the thickness of the photoresist film was measured before and after washing for each ozone treatment time. The results of Inventive Example 4 are shown in Table 2. Moreover, these treatments were all performed at room temperature without heating the substrate 2 or the wet ozone-containing gas, but even more favorable results can be achieved when the substrate 2, the gas conduit 8, and the header 5 are heated.

TABLE 2

|  | Ozone treatment time | Film thickness before washing (nm) | Film thickness after washing (nm) | Average removal speed (nm/min) |
| --- | --- | --- | --- | --- |
| Inventive Example 4-1 | 15 sec | 1550 | 1460 | 360 |
| Inventive Example 4-2 | 30 sec | 1560 | 1340 | 420 |
| Inventive Example 4-3 | 1 min | 1520 | 1140 | 410 |
| Inventive Example 4-4 | 3 min | 1500 | 680 | 290 |
| Inventive Example 4-5 | 5 min | 1480 | 260 | 258 |

As shown in Table 2, a large change in photoresist film thickness was not observed for any treatment time before washing, but the surface of the film had changed color and was sticky. The longer the treatment time, the more marked the degree of change, and it was clear that the photoresist was being decomposed by the wet ozone. Reduction of the photoresist film thickness was found to be dependent on treatment time after washing. Consequently, this inventive example proved that the photoresist can be removed by decomposing the photoresist by wet ozone treatment and then removing the decomposed product by washing.

Furthermore, as can be seen from the items in the average removal speed column in Table 2, a tendency was found for treatment speed to become slower as treatment time is lengthened. This reflects the fact that the reaction proceeds from upper portions of the photoresist, and the longer the treatment time, the more reacted photoresist in the upper portions inhibits penetration of the ozone gas, making it difficult for the wet ozone gas to act on the lower portions of the photoresist.

Inventive Example 5

Figure 6A:
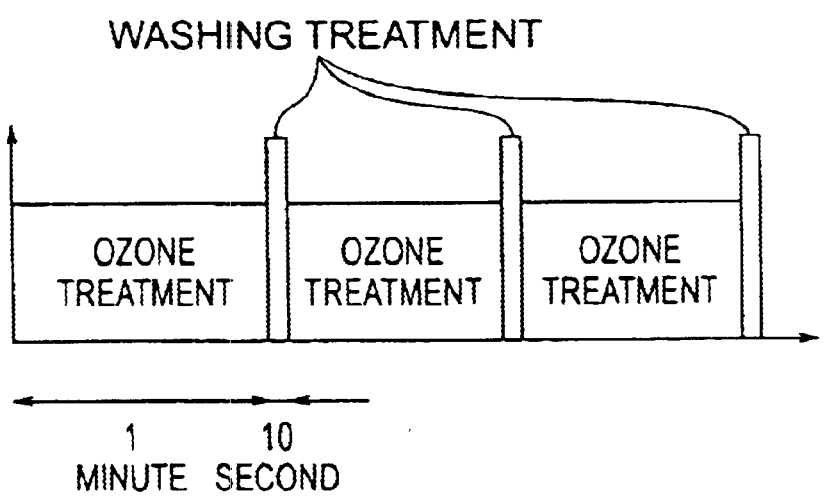
FIG. 6A is a time chart for Inventive Example 5 explaining the substrate treatment method according to Embodiment 3 of the present invention.
Figure 6B:
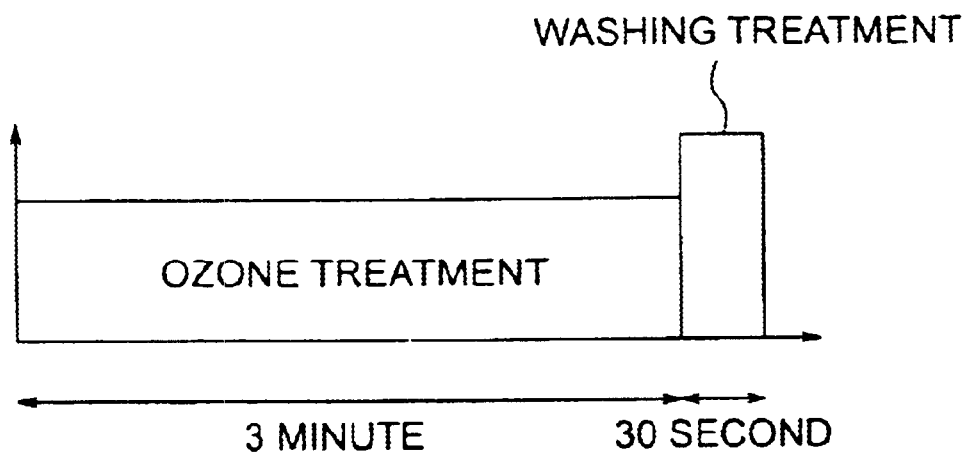
FIG. 6B is a time chart for a reference example explaining the substrate treatment method according to Embodiment 3 of the present invention.

Inventive Example 5 is an iterative experiment to improve on the photoresist stripping speed achieved in Inventive Example 4. First, a substrate 2 formed with a photoresist film prepared under the same conditions as Inventive Example 4 was secured to the base table 3 as shown in FIG. 5 and rotated at frequency of 250 rpm. Ozone-containing gas set at a concentration of 170 g/Nm$^3$ and a flow rate of 3 I/min was made to contain approximately 2.7% moisture by the humidifier 7. The distance between the work surface of the substrate 2 and a lower portion of the header 5 was set at 2.3 mm. The two types of experiment shown in the time charts in FIGS. 6A and 6B were performed in order to test the results of repeating the ozone treatment. FIG. 6A is the present inventive example, and FIG. 6B is a reference example. Moreover, as described below, the reference example does not repeat the ozone treatment, and is similar to Inventive Example 4-4 above. In this example, supplying the wet ozone-containing gas through the header 5 for one minute then supplying pure water at 4 ml/sec for ten seconds using the pump 10 was counted as one cycle, and three cycles were performed. In the reference example, the wet ozone-containing gas was supplied through the header 5 for three minutes then pure water was supplied at 4 ml/sec for thirty seconds. Consequently, the same total amount of wet ozone gas and water were supplied in both Inventive Example 5 and the reference example. The photoresist film thickness for Inventive Example 5 and the reference example, respectively, after performing the ozone treatment is shown in Table 3. Moreover, these treatments were all performed at room temperature without heating the substrate 2 or the wet ozone-containing gas, but even more favorable results can be achieved when the substrate 2, the gas conduit 8, and the header 5 are heated.

TABLE 3

|  | Ozone treatment time | Film thickness after treatment (nm) | Average removal speed (nm/min) |
| --- | --- | --- | --- |
| Inventive Example 5 | 3 × 1 min | 440 | 370 |
| Reference Example | 3 min | 660 | 280 |

As can be seen from Table 3, the stripping speed of the treatment according to the present inventive example, which is the treatment in which ozone treatment and washing (cleaning) are repeated, was greater than the stripping speed of the reference example. Furthermore, because the stripping speed of Inventive Example 5 in Table 3 is the same as the stripping speed of Inventive Examples 4-2 and 4-3 in Table 2, the trend for the stripping speed to peak that was observed in Inventive Example 4 was not observed in the case of Inventive Example 5 even when the total ozone treatment time was three minutes. Inventive Example 5 proves that stripping speed can be further improved by alternately repeating treatment with wet ozone-containing gas and washing treatment at constant time intervals.

Moreover, in this inventive example, the wet ozone-containing gas supply time in each iteration was set to one minute, and the wash treatment was set to ten seconds at 4 ml/sec, but even when cycles in which the wet ozone-containing gas supply time was set to thirty seconds, forty-five seconds, and 1.5 minutes, respectively, and the wash treatment was performed for ten seconds at 4 ml/sec, were repeated for a total of three times, the stripping speed was still greater than one long treatment for the corresponding treatment time.

There is a possibility that the ongoing oxidation of the photoresist by the wet ozone-containing gas may be hindered if pure water introduced during the wash treatment remains on the substrate surface and forms a water film, but in the present embodiment, since the distance between the work surface of the substrate 2 and the header 5 in FIG. 5 is set to be extremely short at 2.3 mm, excess water introduced in the wash treatment is efficiently blown away by the wet ozone-containing gas subsequently introduced, enabling another effect to be claimed in that obstruction of the oxidation reaction by a water film is prevented.

Moreover, the distance between the work surface of the substrate 2 and the header 5 is not limited to 2.3 mm, but a balance must be maintained between the rotational speed of the substrate 2, the spraying speed of the wet ozone-containing gas from the header 5, etc., and it is preferable that the distance be set between approximately 1 mm and 20 mm.

Furthermore, in Inventive Example 5, the ozone treatment time and the wash treatment time were each set to be the same in each iteration, but the same effect can be achieved even if the times are varied from iteration to iteration.

Embodiment 4

Figure 7A:
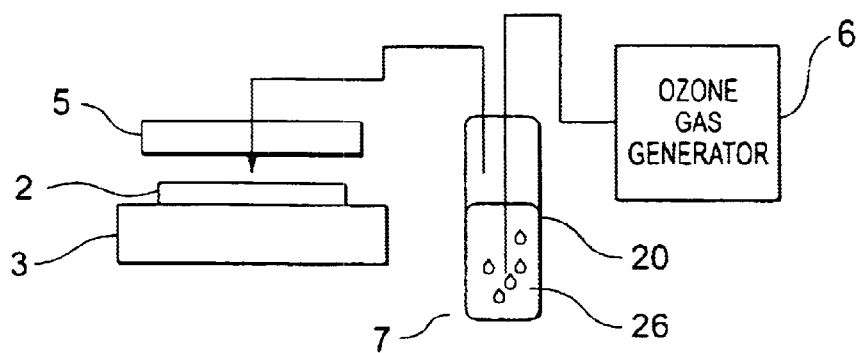
FIG. 7A is a diagram showing part of a construction of the substrate treatment assembly according to Embodiment 4 of the present invention, being an example using a bubbling bottle in a humidifier.
Figure 7B:
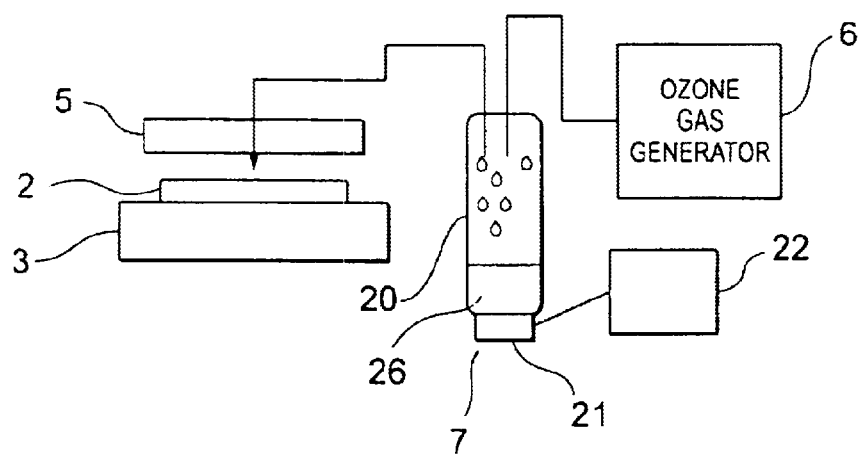
FIG. 7B is a diagram showing part of a construction of the substrate treatment assembly according to Embodiment 4 of the present invention, being an example using ultrasound in the humidifier.
Figure 7C:
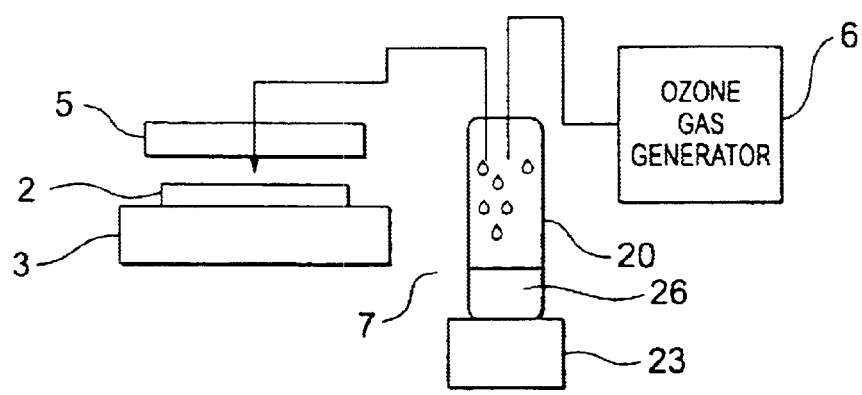
FIG. 7C is a diagram showing part of a construction of the substrate treatment assembly according to Embodiment 4 of the present invention, being an example using a hot plate in the humidifier.

FIGS. 7A, 7B, and 7C are explanatory diagrams showing constructions of part of the substrate treatment assembly according to Embodiment 4 of the present invention. In these figures, 20 is a bubbling bottle, 21 is an ultrasonic vibrator, 22 is an ultrasonic vibrator controller, 23 is a hot plate, and 26 is a treatment solution such as pure water, for example. The construction of the humidifier 7 in each of FIGS. 7A, 7B, and 7C is different, the rest of the construction being the same as in Embodiment 1 in each case. FIG. 7A shows a case using a humidifier 7 of a construction generating wet ozone-containing gas by bubbling ozone-containing gas through a prescribed amount of treatment solution 26 which has been inserted into a bubbling bottle 20, FIG. 7B shows a case using a humidifier 7 of a construction generating wet ozone-containing gas by disposing a ultrasonic vibrator 21 in a lower portion of a glass bubbling bottle 20 and driving water molecules into gaseous phase to bring them into contact with the ozone-containing gas by adjusting the output of an ultrasonic vibrator controller 22, and FIG. 7C shows a case using a humidifier 7 of a construction generating wet ozone-containing gas by heating treatment solution in a bubbling bottle 20 to an arbitrary temperature using a hot plate 23 to drive water molecules into gaseous phase to bring them into contact with the ozone-containing gas.

Inventive Example 6

Next, Embodiment 4 will be explained further based on Inventive Example 6. In Inventive Example 6, humidifying methods using the above three types of construction were tested under conditions similar to Inventive Example 4 above: rotational frequency of the substrate 2 at 250 rpm; ozone concentration at approximately 170 g/Nm$^3$; flow rate of ozone-containing gas at 3 I/min; absolute humidity at approximately 2.7%; distance between the work surface of the substrate 2 and the header 5 set at 2.3 mm; treatment with wet ozone-containing gas for one minute; and wash treatment at 4 ml/sec for 10 seconds. The results of Inventive Example 6 are shown in Table 4. Moreover, these treatments were performed at room temperature without heating the substrate 2, the gas conduit 8, or the header 5, but even more favorable results can be achieved when the substrate 2, the gas conduit 8, and the header 5 are heated.

TABLE 4

|  | Humidifying method | Film thickness before treatment (nm) | Film thickness after washing (nm) | Average removal speed (nm/min) |
|---|---|---|---|---|
| Inventive Example 6-1 | (a) bubbling | 1550 | 1080 | 470 |
| Inventive Example 6-2 | (b) ultrasound | 1550 | 1100 | 450 |
| Inventive Example 6-3 | (c) hot plate | 1560 | 1090 | 470 |

As can be seen in Table 4, no great difference was found between the average removal speeds of any of the humidifier constructions. This is considered to be because even if the humidity is different during humidification of the ozone-containing gas, any moisture content above the saturated vapor level corresponding to the temperature of the gas conduit 8 is liquefied by condensation as it passes through the gas conduit 8 and adheres to the pipe portion. Consequently, this proves that the amount of moisture reaching the substrate 2 in any of the humidifying methods is always the saturated vapor level at the ambient temperature, that is, the temperature of the gas conduit 8 and the header 5, and that any of the humidifying methods is effective in generating wet ozone-containing gas. It is also clear that the amount of moisture supplied to the substrate 2 depends greatly on the temperature of the gas conduit 8 and the header 5. In that sense also, it was found that it is necessary to keep the temperature of the gas conduit 8 and the header 5 high.

Comparative Example 1

In Comparative Example 1, a similar experiment was performed using dry ozone gas which had not been passed through a humidifier 7 in order to further clarify the effects of wet ozone. First, a photoresist film of approximately 1550 nm was formed by applying a positive photoresist (TFR-B, manufactured by Tokyo Ohka Kogyo, Co., Ltd.) to a surface-cleaned glass substrate 2 (surface pre-coated with a 400 nm chrome film) using a spin coater and post-baking for three minutes at 120° C.

Next, the substrate 2 on which the photoresist film was formed was secured to the base table 3 as shown in FIG. 5, and rotated at frequency of 250 rpm. The distance between the substrate 2 and the header 5 was set at 2.3 mm. Ozone-containing gas (dew point: −50° C.) set at a concentration of approximately 170 g/Nm³ and a flow rate of 3 I/min was supplied through the header 5 to the substrate 2 for one minute, then washing (cleaning) was performed by supplying pure water at 4 ml/sec for 10 seconds using the pump 10. Moreover, the above treatment was performed at room temperature without heating the substrate 2. The supply time for the ozone-containing gas was varied to three minutes and five minutes under the same conditions and the thickness of the photoresist film was measured before and after washing (cleaning) for each ozone treatment time. The results of Inventive Example 1 are shown in Table 5.

TABLE 5

|  | Ozone treatment time (min) | Film thickness before treatment (nm) | Film thickness after washing (nm) | Average removal speed (nm/min) |
|---|---|---|---|---|
| Comparative Example 1-1 | 1 min | 1550 | 1540 | 10 |
| Comparative Example 1-2 | 3 min | 1550 | 1510 | 13 |
| Comparative Example 1-3 | 5 min | 1550 | 1500 | 10 |

As shown in Table 5, photoresist film thickness was barely reduced regardless of treatment time even after washing. Consequently, this Comparative Example proves that oxidation of the photoresist barely proceeds with dry ozone.

Tables 4 and 5 clearly showed the difference in photoresist stripping speed between wet ozone-containing gas and dry ozone-containing gas. Thus, analyses of the water after washing were performed for Inventive Example 6-1 in Table 4 and Comparative Example 1-1 in Table 5. Total organic carbon (TOC) was measured to compare the total organics content, and ion chromatography was performed to compare ionic compounds. The results thereof are shown in Table 6.

TABLE 6

|  | TOC (ppm) | Ion chromatography | | |
|---|---|---|---|---|
|  |  | Oxalic acid ions (ppm) | Tartaric acid ions (ppm) | Formic acid ions (ppm) |
| Inventive Example 6-1 (wet ozone treatment) | 62.3 | 27 | 20.8 | 9.2 |
| Comparative Example 1-1 (dry ozone treatment) | 4.2 | 1.7 | 1.3 | 0.4 |

As can be seen from Table 6, the TOC analysis values are higher for the water after the treatment with wet ozone-containing gas (the treatment in Inventive Example. 6-1), indicating a high content of photoresist decomposition products. Similarly, for ion chromatography, the total detected amounts were dependent on the amount of stripping (removal) and were greater in the water from washing after the wet ozone-containing gas treatment. The detected ions were all carboxylic acids. These are known to be end products in reactions between organics and ozone. Because the molecules were produced by the reaction between the wet ozone-containing gas and the photoresist, and the total concentration of these organic carboxylic acids detected by ion chromatography was generally the same as the TOC concentration, it was clear that almost all of the products from the reaction between the wet ozone and the photoresist molecules were organic acids represented by carboxylic acids. On the other hand, there were almost no organics in the water from washing after the dry ozone-containing gas treatment. These results can be said to indicate that the presence of water molecules is an essential requirement for the photoresist oxidation reaction.

In other words, photoresist stripping with ozone has hitherto been considered to be oxidation of photoresist by ozone molecules and dissolution and removal into water of fragmented photoresist molecules decomposed by oxidation. However, from the results obtained in these inventive examples, it is clear that photoresist film removal treatment proceeds according to a reaction mechanism involving ozone oxidation and hydrolysis of the photoresist by ozone and water molecules and dissolution and removal into water of decomposed and fragmented photoresist molecules.

Embodiment 5

Figure 8:
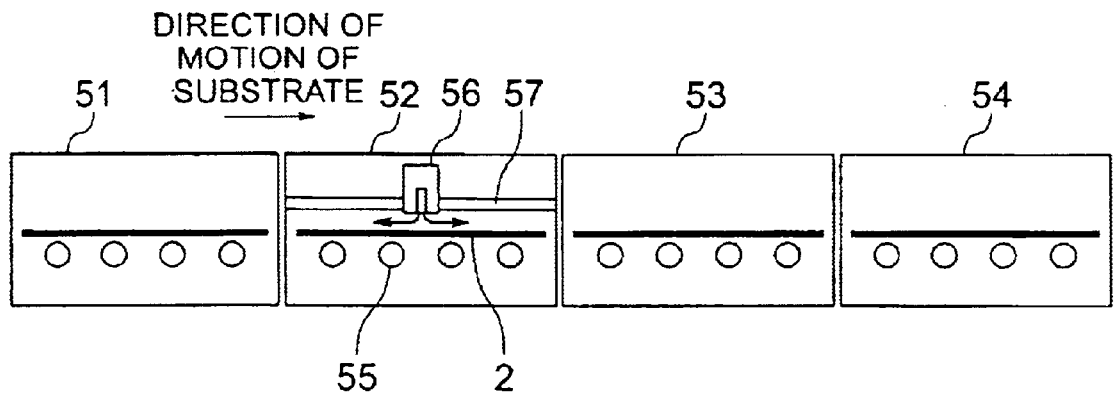
FIG. 8 is a diagram schematically showing a construction of the substrate treatment assembly according to Embodiment 5 of the present invention.

The above explanations have centered around small substrates, but treatment methods in which the substrate is rotated are not very practical for large plates such as substrates for LCDs. FIG. 8 is a diagram schematically explaining a construction of the substrate treatment assembly according to Embodiment 5 of the present invention, and shows the construction of a treatment assembly which is particularly effective in the treatment of large substrates such as LCDs. This substrate treatment assembly is composed of a preheating portion 51 for preheating the substrate 2, an ozone treatment portion (ozone treatment tank) 52, a washing portion (cleaning portion) 53, and a drying portion 54. The substrate 2 is conveyed continuously in one direction through the assembly by rollers 55 and a photoresist film on the substrate 2 is removed. Moreover, conveyance may also be performed in steps after each type of treatment instead of continuously.

Figure 9:
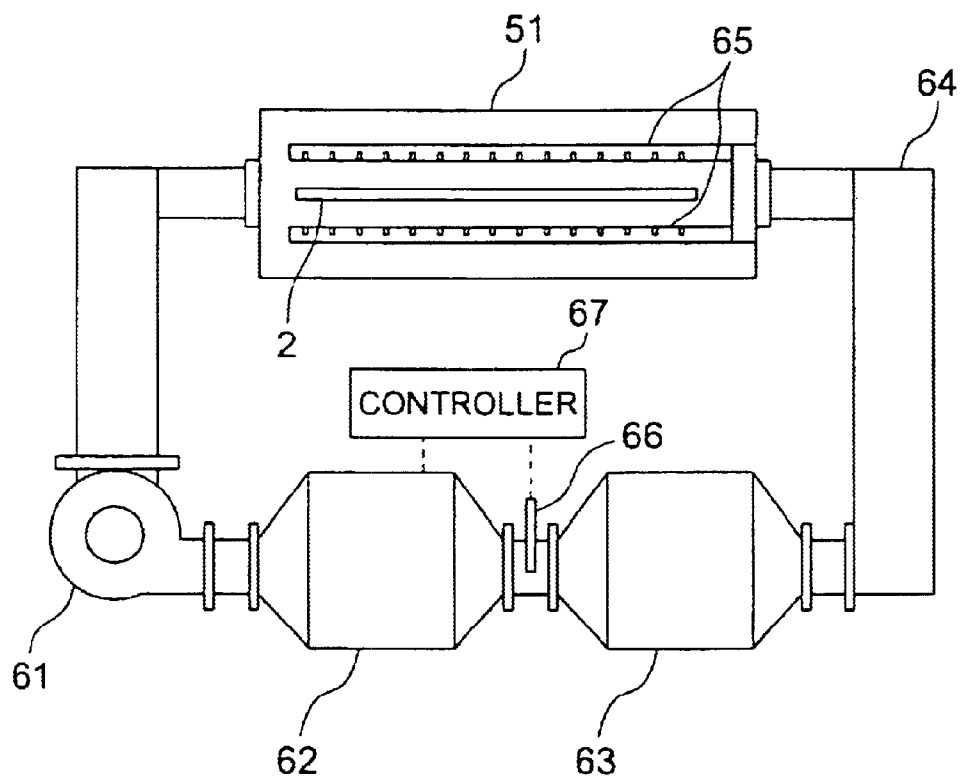
FIG. 9 is a diagram explaining a construction of a substrate preheating portion according to Embodiment 5 of the present invention.

The preheating portion 51 is a portion for heating the substrate 2 in advance and is constructed as shown in FIG. 9. In FIG. 9, 61 is a blower, 62 is a heater, 63 is a filter, 64 is an air duct, 65 are hot-air spray headers, 66 is a temperature detector, and 67 is a controller. Hot air heated by the heater 62 is blown through the air duct 64 onto the substrate 2 by the blower 61 to heat the substrate 2. The filter 63 is disposed in the air channel to prevent contaminants, etc., from adhering to the substrate 2. The hot air is sprayed from the hot-air spray headers 65 which are disposed on both the front and rear sides of the substrate 2 to prevent the substrate 2 from warping due to differences in thermal expansion at the front and rear surfaces during heating. When the size of the substrate 2 was 730 mm×920 mm, it was possible to raise the temperature of the substrate 2 to a predetermined temperature (80° C., for example) in approximately 30 seconds by spraying a gas such as air onto the substrate 2 at a heater capacity of 3 kW, a gas flow rate of 20 m$^3$/min, and a gas temperature of 100° C. Because warping of the glass plate, or cracking which results from warping, occurs if the temperature of the substrate 2 is raised too quickly, it is desirable to set the temperature raising time to 20 seconds or more. Control of the gas temperature was achieved by measuring the gas exit temperature from the heater 62 using the temperature detector 66, and adjusting the voltage to the heater 62 using the controller 67 so that the gas temperature was kept constant.

Moreover, preheating is possible by immersing the substrate 2 in hot water, for example, instead of using hot air. However, in that case, it is necessary to dry the substrate 2 completely after heating. This is because, if the substrate is not completely dry, portions where water droplets remain cannot be treated during the next step which is wet ozone treatment. Heating by hot air is more advantageous when one considers equipment cost and the size of the assembly. Of course, lamp heating, etc., is also similarly effective.

A straight nozzle 56 having a long narrow slit-shaped mouth whose length corresponds to a width dimension of the substrate 2 (i.e., the length in a direction perpendicular to the direction of motion of the substrate) is disposed in the ozone treatment portion 52, and a wet ozone-containing gas is sprayed onto the substrate from this slit-shaped nozzle 56 to remove the photoresist on the substrate 2. A gas guide 57 is disposed in the ozone treatment portion 52 so that the wet ozone-containing gas sprayed from the nozzle 56 flows in the direction of the arrows and is effectively utilized. A slit opening width dimension within a range of 0.1 mm to 1 mm was found to be effective. However, it became clear that if the opening width is set too small, irregularities in the opening width change the local wet ozone-containing gas spray rate, giving rise to irregularities in photoresist removal performance. In this assembly, it is necessary to keep irregularities in slit opening width at a precision of ±50 percent or less, and preferably ±10 percent or less.

It is necessary to set the temperature of the nozzle 56 portion approximately at or above the temperature of the wet ozone-containing gas because if the temperature of tile nozzle 56 portion is lower there is a risk that moisture in the wet ozone-containing gas will condense when the high-temperature wet ozone-containing gas reaches the nozzle 56 portion, making the moisture supply rate to the substrate 2 insufficient, or condensed moisture may drip onto the substrate 2 as water droplets. Similarly, if a heating device capable of raising the temperature of the entire ozone treatment portion, including the rollers 55, etc., approximately to the temperature of the wet ozone-containing gas is disposed, condensation problems and unwanted cooling of the substrate 2 can be effectively eliminated. Although not shown, heating devices are also disposed on a humidifier for humidifying ozone-containing gas and on a gas conduit connecting the humidifier to the nozzle 56.

Ozone-resistant materials such as quartz glass or fluorocarbon resin are used in portions of the ozone treatment portion 52 exposed to the ozone.

Although not shown, cleaning solution spray nozzles for spraying a cleaning solution onto the substrate 2 from above and below are disposed in the washing portion 53, being constructed to enable cleaning of the substrate 2 after ozone treatment in the ozone treatment portion 52.

Although not shown, nitrogen gas spray nozzles for spraying nitrogen gas onto the substrate 2 from above and below are disposed in the drying portion 54, being constructed to enable drying of the substrate 2 after cleaning in the washing portion 53.

Embodiment 6

Embodiment 6 of the present invention uses the substrate treatment assembly described in Embodiment 5 above, and the wet ozone-containing gas spray nozzle used in this substrate treatment assembly is constructed as shown in FIGS. 10A and 10B. FIG. 10A is a cross section of this nozzle and FIG. 10B is an end elevation of the same nozzle. In this embodiment, a wet ozone-containing gas spray nozzle 121 is constructed to enable a slit width to be adjusted, effectively homogenizing photoresist removal performance. In FIGS. 10A and 10B, 121 is a flow rate adjustment nozzle, 122 are flow rate adjustment screws, 123 is a wet ozone-containing gas supply port, 124 is a warm water supply port, and 125 is a straight nozzle portion. 125a is a movable plate disposed in the nozzle portion 125, which may be a thin anodized aluminum plate, for example, and a portion of the movable plate 125a is joined to the nozzle portion 125 by welding or the like.

Wet ozone-containing gas is introduced through the supply port 123 and is sprayed through the nozzle portion. A number of the flow rate adjustment screws 122 are disposed in the nozzle 121 and a homogenous gas flow rate can be achieved across the entire region by adjusting the screws 122 to move the movable plate 125a and change the opening width of the nozzle portion 125. By passing warm water through the warm water supply port 124 to the inside of the nozzle 1221, vapor in the wet ozone-containing gas is prevented from condensing at the nozzle portion 125 before it reaches the substrate 2 which would otherwise lower photoresist removal performance.

Embodiment 7

Figure 11:
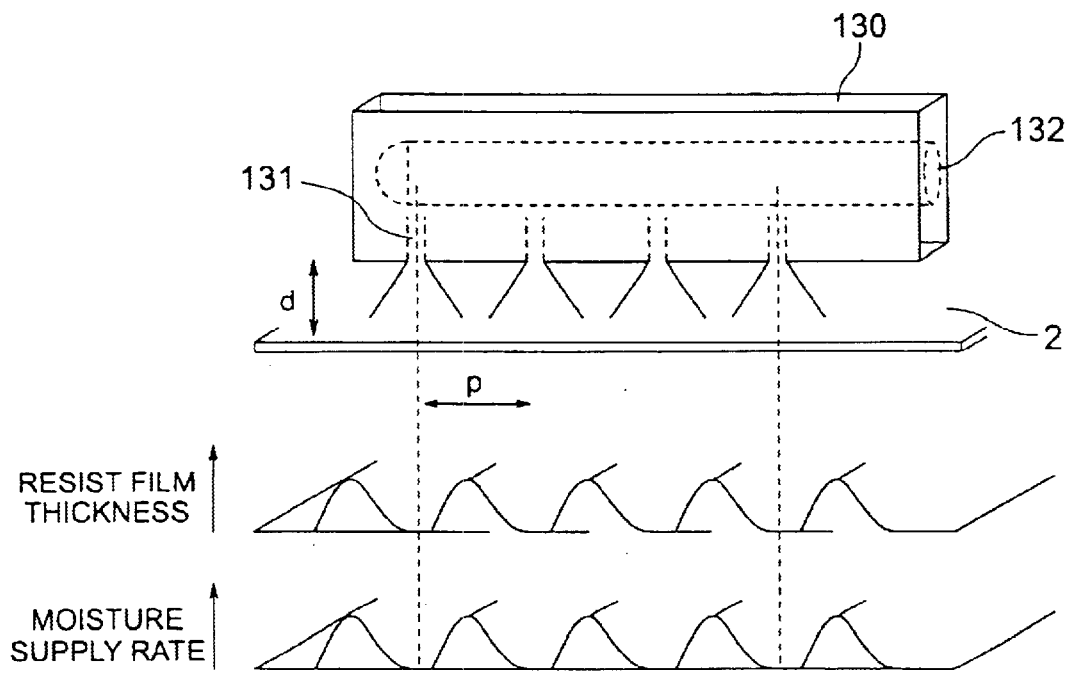
FIG. 11 relates to Embodiment 7 of the present invention and is a diagram explaining the action of a generic aperture-type nozzle.

In proposing Embodiment 7 of the present invention, an experiment was conducted in which the slit-type nozzle was replaced by an aperture-type nozzle in order to provide a less expensive nozzle. FIG. 11 is a diagram explaining the action of a generic aperture-type nozzle. In this figure, 130 is the aperture-type nozzle, 131 is an aperture for spraying wet ozone, and 132 is a wet ozone-containing gas supply port. By forming a number of the apertures 131 in the nozzle, the nozzle can be manufactured inexpensively and with high precision.

The optimal pitch p between the apertures 131 is dependent on a distance d between the nozzle 130 and the substrate 2, and good photoresist removal properties were generally obtained when p was approximately equal to d. However, when viewed in fine detail as shown in FIG. 11, it was determined that photoresist was more likely to be removed immediately below each aperture 131, and less likely to be removed between the apertures 131. As also shown in FIG. 11. this was found to be because immediately below each aperture 131 excess moisture is removed by the gas flow, but the moisture removed from immediately below each aperture 131 pooled between the apertures 131, creating an overly moist state and reducing the photoresist removal action in those portions.

Figure 12:
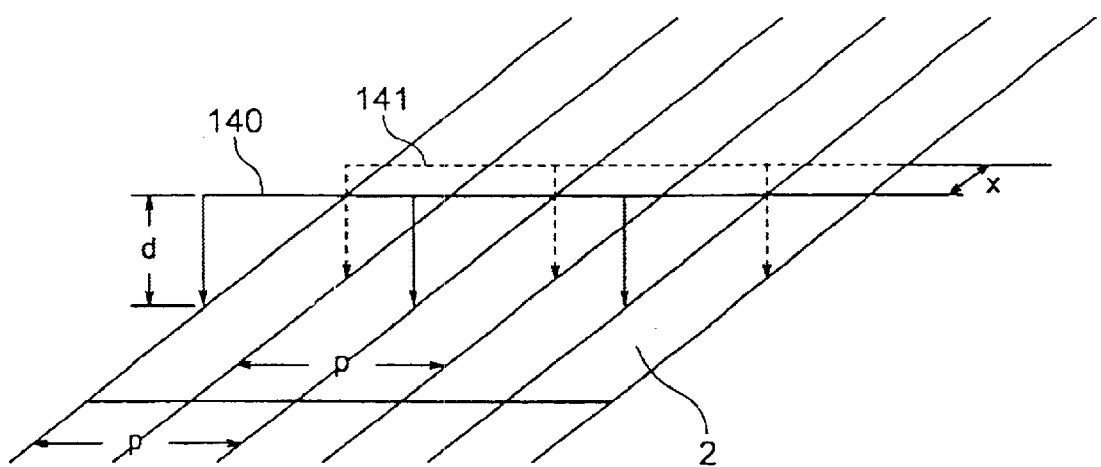
FIG. 12 is a diagram explaining the construction of an aperture-type nozzle according to Embodiment 7 of the present invention.

Embodiment 7 overcomes these problems and achieves even higher photoresist removal performance. The construction of the nozzle according to Embodiment 7 will be explained using FIG. 12. Moreover, the construction of the substrate treatment assembly as a whole is the same for Embodiment 7 as that described in Embodiment 5. As shown in FIG. 12, first and second aperture-type nozzles 140 and 141 are disposed one after the other in the direction of motion of the substrate 2, the apertures being arranged into a zigzag formation by disposing the apertures of the second nozzle 141 in central portions between the apertures of the first nozzle 140.

By adopting this construction, when the substrate 2 is moved relative to the first and second nozzles 140 and 141, moisture accumulates between the apertures at the first nozzle 140, but moisture which has been accumulated by the first nozzle 140 is removed by the second nozzle 141, improving photoresist removal performance by homogenizing the moisture distribution on the substrate 2. In this case, the effect is reduced if the spacing between the first and second nozzles 140 and 141 is too close, and it is effective to set the distance x between the first and second nozzles 140 and 141 to 5 mm or more, preferably to 20 mm or more. In this case also, the optimal pitch p between the apertures 131 for the distance d between the nozzles 140 and 141 and the substrate 2 was when p was approximately equal to d.

Naturally, the effect can be increased by providing three or more rows of nozzles and positioning the apertures so as not to align with the apertures in the other rows.

By using a gas disperser as a means of supplying wet ozone-containing gas, as explained above, which includes a number of apertures (nozzles 140 and 141) aligned in a number of rows in a width direction of the substrate 2 (i.e., a direction perpendicular to the direction of motion of the substrate 2 relative to the nozzles 140 and 141) and the apertures in adjacent rows do not align with each other in a direction perpendicular to the rows, that is, in the direction of relative motion of the substrate 2, and by constructing a gas disperser or the substrate such that at least one of either the gas disperser or the substrate moves in a direction perpendicular to the rows of the aligned apertures (the nozzles 140 and 141), it becomes possible to perform substrate treatment using an aperture-type gas disperser which can be manufactured inexpensively and with high precision without lowering treatment efficiency.

Embodiment 8

Figure 13:
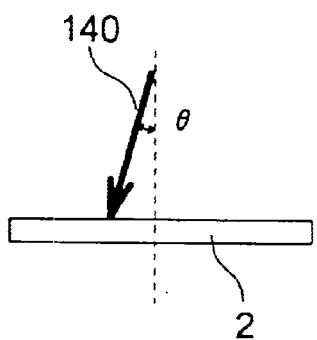
FIG. 13 is a diagram explaining the action of an inclined nozzle according to Embodiment 8 of the present invention.

FIG. 13 is a diagram explaining the action of an inclined nozzle according to Embodiment 8 of the present invention. In this embodiment, the construction is the same as in each of Embodiments 5 to 7 above except that the nozzle for spraying the wet ozone-containing gas is inclined so as to spray the wet ozone-containing gas at an angle relative to the direction of progress of the substrate 2 (i.e., the direction of motion of the substrate 2 relative to the nozzles 140 and 141).

It was determined that photoresist removal performance is improved if the gas is sprayed at an angle relative to the direction of progress of the substrate 2, as shown in FIG. 13, rather than spraying in a direction perpendicular to the substrate 2. Favorable results were obtained when the angle of inclination was within a range from ten degrees to thirty degrees. This is considered to be because when the wet ozone-containing gas collides with the substrate 2, the spray speed of the gas is combined with the speed of progress of the substrate 2, improving photoresist removal performance.

Embodiment 9

Figure 14:
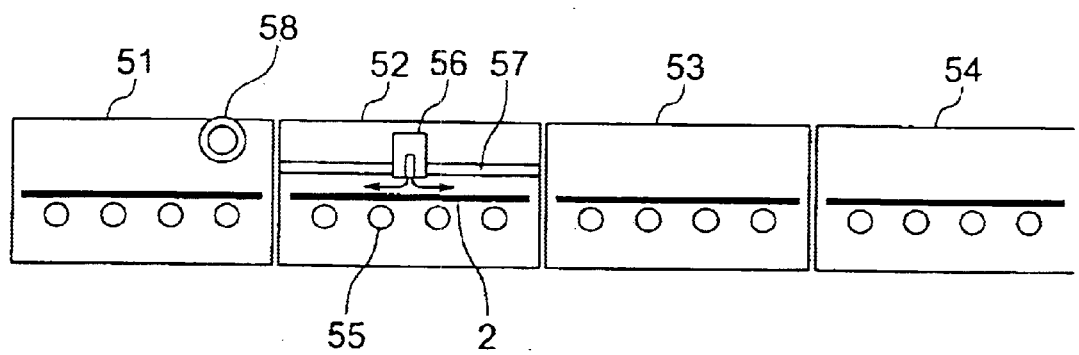
FIG. 14 is a diagram schematically showing a construction of the substrate treatment assembly according to Embodiment 9 of the present invention.

FIG. 14 is a diagram schematically explaining a construction of the substrate treatment assembly according to Embodiment 9 of the present invention. In this figure, 58 is a high-pressure ultraviolet lamp: As shown in FIG. 14, the high-pressure ultraviolet lamp 58 is disposed in the substrate preheating portion 51, and the photoresist removal speed is improved by providing the high-pressure ultraviolet lamp 58 which emits ultraviolet light having a wavelength in the vicinity of 350 nm before performing the ozone treatment.

In a normal photoresist, there are azide radicals present at the edges and ozone gas is consumed in the treatment of these azide radicals. However, it was discovered that by irradiating the azide radicals with ultraviolet rays first, the azide radicals are decomposed, achieving a reduced ozone consumption rate and increased treatment speed.

Moreover, in order to treat the azide radicals, ultraviolet rays of any wavelength will have sufficient energy, but since the ultraviolet rays will be absorbed at the surface of the photoresist and will be less likely to penetrate inside the photoresist material if the wavelength of the rays is too short, it is more effective to use light of comparatively longer wavelength such as 300 nm or more which can treat the entire photoresist.

Embodiment 10

Figure 15:
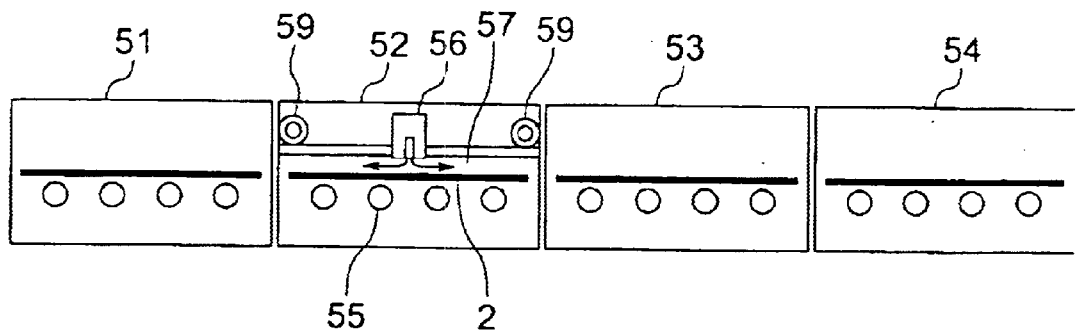
FIG. 15 is a diagram schematically showing a construction of the substrate treatment assembly according to Embodiment 10 of the present invention.

FIG. 15 is a diagram schematically explaining a construction of the substrate treatment assembly according to Embodiment 10 of the present invention. In FIG. 15, 59 are low-pressure mercury lamps emitting ultraviolet light having a wavelength in the vicinity of 250 nm. In this embodiment, the gas guide 57 is formed from quartz glass which permits passage of ultraviolet light, and is constructed such that the wet ozone-containing gas sprayed from the nozzle 56 is irradiated from above the gas guide 57 with ultraviolet light having a wavelength in the vicinity of 250 nm. The ultraviolet light having a wavelength in the vicinity of 250 nm decomposes the ozone and generates oxygen radicals which have even more intense oxidation strength than ozone. These oxygen radicals are effective in decomposing photoresist remnants (residue) and also lower the concentration of ozone in the exhaust gas.

Embodiment 11

Figure 16:
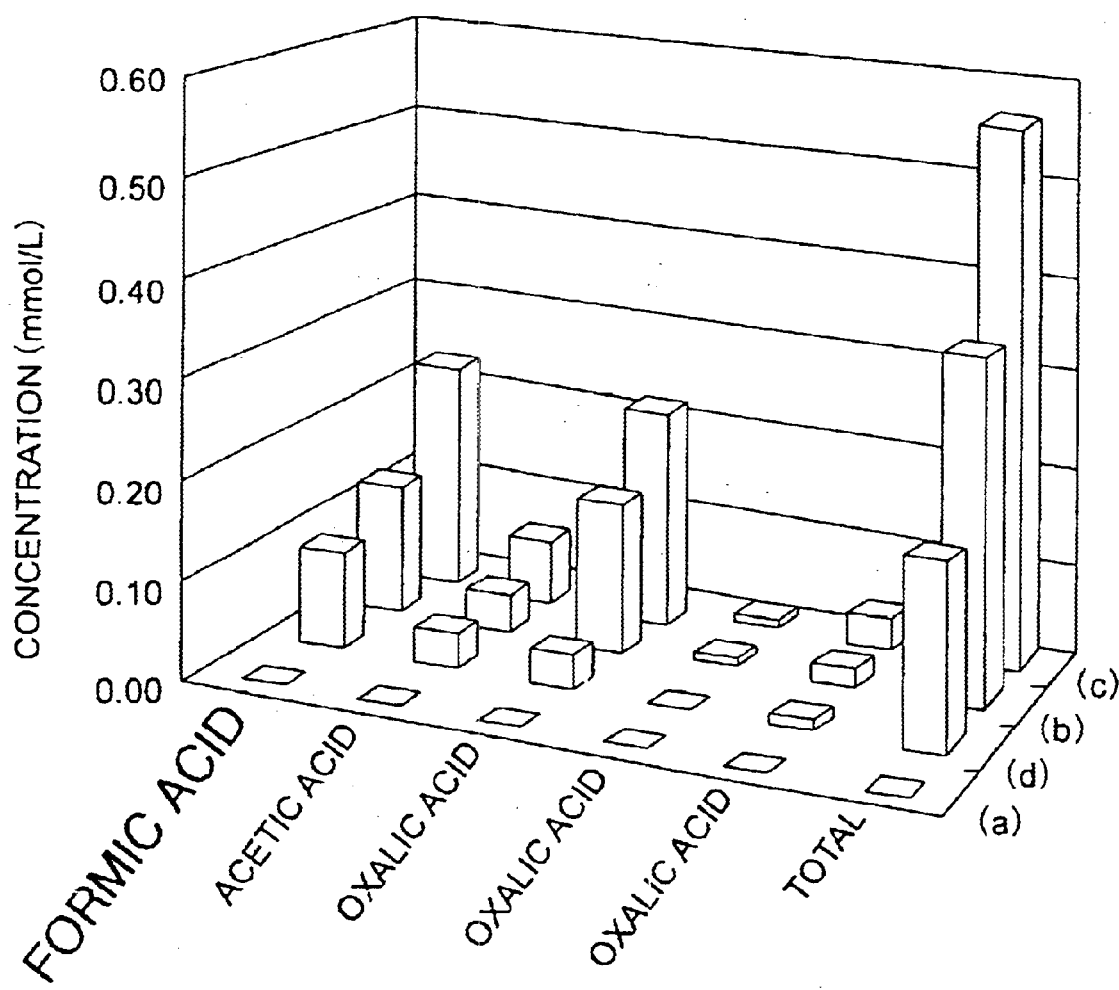
FIG. 16 is a graph to explain the substrate treatment method according to Embodiment 11 of the present invention.

Cleaning is normally performed with a room temperature cleaning solution such as pure water, for example, but if warn water is used instead, photoresist removal speed can be further improved. Embodiment 11 uses warm water as the cleaning solution. FIG. 16 is a graph to explain the substrate treatment method according to Embodiment 11 of the present invention and shows the composition of solutes after cleaning with room-temperature pure water and 700° C. pure water. In FIG. 16, (a) is a case in which cleaning was performed with room-temperature pure water after spraying with wet oxygen gas, (b) is a case in which cleaning was performed with room-temperature pure water after spraying with 79° C. wet ozone-containing gas, (c) is a case in which cleaning was performed with 85° C. pure water after spraying with 79° C. wet ozone-containing gas, and (d) is a case in which cleaning was performed with room-temperature pure water after spraying with room-temperature wet ozone, each showing results of the composition and concentrations of organic acids in the treatment water measured in experiments by the present inventors.

From this graph, it can be seen that removal speed is accelerated by cleaning with warm water as in the case of (c), and that the ratio of higher order organic acids such as oxalic acid in the solutes is increased. In other words, it can be said that by cleaning with warm water, the photoresist removal speed is increased because the solubility of organic acids into the water rises and even high-order organic acids are dissolved and removed.

Embodiment 12

Each of the above embodiments has been explained for cases using pure water as the cleaning solution, but photoresist removal speed can be further improved if a solution is used which easily dissolves photoresist molecules which have been reduced to a low molecular weight. Embodiment 12 was made with this in mind. The cleaning solution in this Embodiment 12 is preferably a solution which easily dissolves photoresist film after reaction with ozone and can be selected from a group including: pure water and ultrapure water; acidic aqueous solutions of sulfuric acid, hydrochloric acid, nitric acid, acetic acid, hydrogen peroxide, or the like; alkaline aqueous solutions of ammonium hydroxide or the like; organic solvents including ketones such as acetone and alcohols such as isopropanol; and mixtures of the above.

In the semiconductor manufacturing process in particular, it is useful to add minute quantities of chemicals such as the above acidic aqueous solutions, alkaline aqueous solutions, ketones, alcohols, etc., to the cleaning solution to remove residues which have caked after etching or where ions have been doped in high concentration ($10^{15}/cm^2$, for example), etc.

Embodiment 13

Solutions which easily dissolve photoresist film after reaction with ozone such as described in Embodiment 12 may of course be used not only during cleaning but also as treatment solutions for wetting the ozone-containing gas. Embodiment 13 was made with this in mind. As a specific example, a solution such as described in Embodiment 12 may be inserted into the bubbling bottle 20 in FIG. 7. This case is even more effective than Embodiment 12 because it is possible to use less solution.

Embodiment 14

Next, the substrate treatment method according to Embodiment 14 will be explained using FIGS. 17A, 17B, add 17C, using a treatment process in which a photoresist removal process is applied to a liquid crystal display (LCD) as an example and making a comparison with a conventional generic LCD photoresist removal process.

Figure 17A:
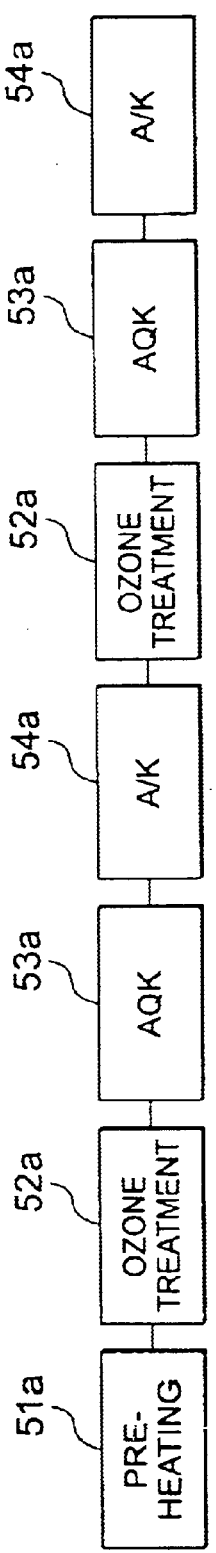
FIG. 17A is a diagram explaining the substrate treatment method according to Embodiment 14.
Figure 17B:
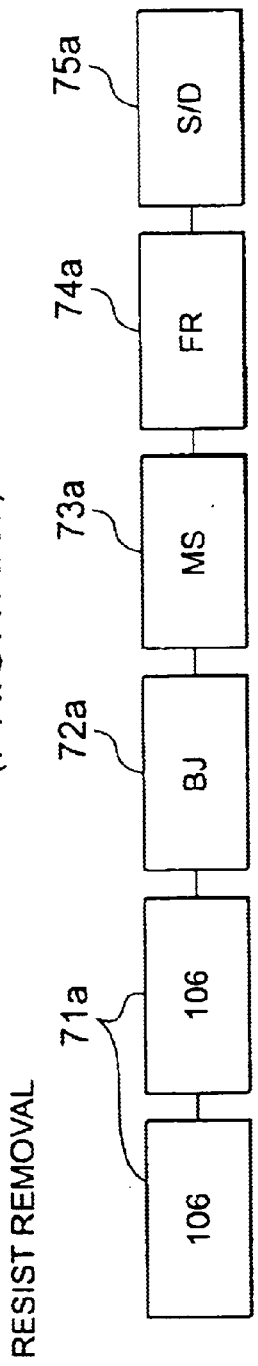
FIG. 17B is a diagram explaining a conventional photoresist removal process.
Figure 17C:
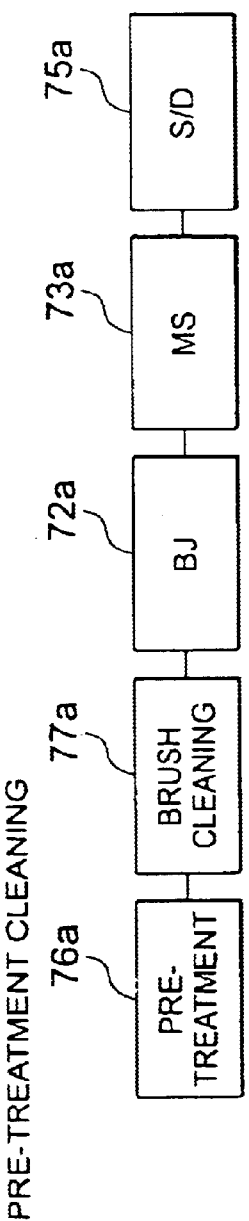
FIG. 17C is a diagram showing a pretreatment process required by the conventional photoresist removal process before moving to a subsequent process.

As shown in FIG. 17B, the conventional generic LCD photoresist removal process includes six washing processes: two cleaning processes 71 using 106 solution; a cleaning process 72 using a bubble jet; a washing process 73 using ultrasonic application; a final rinsing process 74 using ultrapure water; and a spin drying process 75. In order to move to the next manufacturing step in this conventional generic LCD photoresist removal process, a pretreatment cleaning process is required to completely remove chemicals (106 solution) and to improve the quality of the substrate surface (wettability improvement). As shown in FIG. 17C, this process includes: an ultraviolet treatment process 76; a brushing process 77; a bubble jet cleaning process 72; an ultrasound washing process 73; and a spin drying process 75. Consequently, the above conventional generic removal process requires eleven steps for photoresist removal and pretreatment cleaning, and also a corresponding number of treatment tanks, leading to increased costs and an enlarged footprint (plant floor area).

In contrast to this, as shown in FIG. 17A, the substrate treatment method according to Embodiment 14 of the present invention has as its basic processes: a preheating process 51a; a treatment process 52a using wet ozone-containing gas; a washing process (cleaning process) 53a using an aquaknife; arid a drying process 54a using an air knife. The aquaknife and the air knife spray water and air, respectively, onto the substrate to clean and dry the substrate. In the case of difficult-to-remove photoresist, additional wet ozone-containing gas treatment processes 52, a aquaknife cleaning processes 53a, and air knife cleaning processes 54a may be added in series. In that case, it is more effective to use warm water and warm air in the earlier washing (cleaning) and drying processes 53a and 54a to prevent the temperature of the substrate from dropping after the cleaning and drying.

The present inventors have confirmed that it is possible, using the present embodiment, to achieve a photoresist removal process having approximately the same number of treatment tanks (seven) as the conventional example (six) without having to use any chemicals (106 solution). A substrate treatment method and substrate treatment assembly were obtained having significantly reduced running costs and only a small environmental burden without using expensive highly-purified chemicals (106 solution).

Moreover, here, a case in which two iterations of wet ozone-containing gas treatment processes 52a, aquaknife washing processes 53a, and air knife cleaning processes 54a was indicated, but in the case of an easy-to-remove treatment subject, one iteration would suffice, and in the case of a difficult-to-remove subject the treatment may be repeated three or more times.

It was also found that, like ultraviolet radiation, wet ozone has a surface modifying effect, and when applying wet ozone treatment there was absolutely no need for the pretreatment cleaning conventionally performed. In other words, it was found that by using the substrate treatment method according to this embodiment as shown in FIG. 17A, it was possible to simultaneously achieve both the conventional photoresist removal process and the pretreatment cleaning process which would normally be a separate subsequent step. Thus, the number of treatment tanks can be significantly reduced, achieving a significant reduction in footprint, installation costs, etc.

Embodiment 15

Each of the above embodiments, is based on the premise that the amount of vapor (amount of moisture) supplied to the work surface of the substrate 2 from the wet ozone-containing gas is constant throughout the treatment time period and is not varied intentionally, but having researched still further the present inventors have discovered that there is room for further improvement in methods in which the amount of vapor (amount of moisture) supplied to the work surface of the substrate 2 from the wet ozone-containing gas is kept constant. Embodiment 15 is based on that knowledge, and points where there is room for improvement will first be described.

Figure 18A:
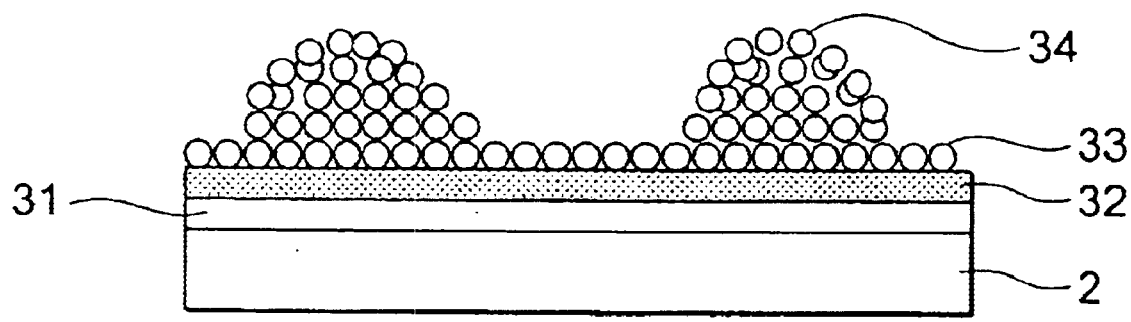
FIG. 18A relates to Embodiment 15 of the present invention and is a diagram explaining a mechanism by which granular residue forms showing the state of treatment solution at the substrate surface early in the treatment process.
Figure 18B:
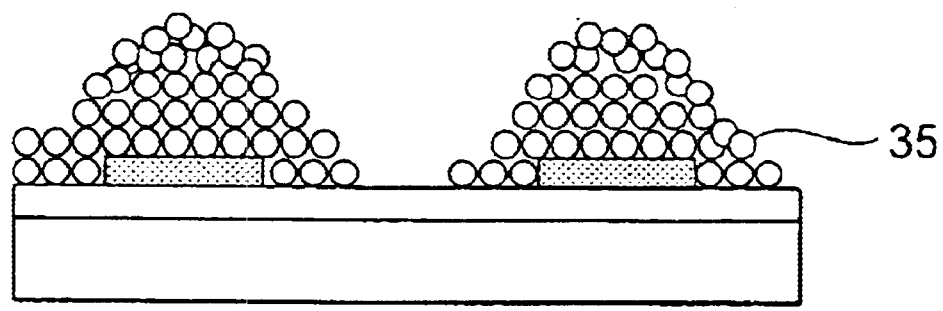
FIG. 18B relates to Embodiment 15 of the present invention and is a diagram explaining a mechanism by which granular residue forms showing the state of the treatment solution at the substrate surface in the latter half of the treatment process.

In Inventive Example 1 above, when treatment was continued with the substrate 2 temperature at 68° C. and the wet ozone-containing gas temperature at 80° C., which were the optimal conditions therein, although the photoresist film could be removed quickly in the early stages of the treatment process at 1.25 $\mu$m/min, from midway through the treatment process, granular residue with a diameter of approximately 1 mm remained on the substrate 2, and it became clear that this granular residue could not be easily removed, even if the treatment time was increased. Then, as a result of analysis, the composition of the residual film was found to be the same as the original composition of the photoresist, and oxidation treatment of the granular residual film by the ozone had not taken place at all. As a result of detailed studies of the condensation state at the work surface of the substrate 2 and the photoresist removal process, it became clear that this granular residual film is generated by a process such as that shown in FIGS. 18A and 18B. FIG. 18A shows accumulation of treatment solution at the substrate surface at an early stage shortly after the commencement of treatment, and FIG. 18B shows the accumulation of the treatment solution at the substrate surface in the latter half of the treatment.

In FIGS. 18A and 18B, 31 and 32 represent an underlayer of chromium or the like and the photoresist film, respectively, laid down on the work surface of the substrate 2, and 33 represents water molecules. In a method which utilizes a temperature difference between the wet gas and the substrate 2 to impart moisture to the work surface of the substrate 2, as shown in FIG. 18A, the treatment solution gathers and forms globular portions (solution beads 34) on the work surface of the substrate 2 due to surface tension in the liquid. In these portions, thickness of the treatment solution increases to approximately 1 mm or more, and this layer of treatment solution obstructs the ozone from contacting the photoresist, reducing the photoresist removal speed to an extreme. On the other hand, in portions where the solution beads 34 have not formed, oxidation of the photoresist by the ozone and hydrolysis by the treatment solution work well, and the photoresist is broken down quickly. Thus, it is thought that the photoresist is removed in portions without beads 34 of treatment solution, and the photoresist remains in portions under the solution beads 34 as the granular residual film 35.

As the process progresses further, if the photoresist components are completely removed locally and the surface of the underlayer 31 is exposed, (see FIG. 18B), since the underlayer 31 is usually hydrophobic, the treatment solution in these portions is repelled, covering the surface of the hydrophilic granular residual film with an even larger amount of treatment fluid. In this state, because the ozone is supplied through a thick layer of treatment solution, the removal reaction is completely prevented from proceeding.

Because Embodiment 15 was made with the aim of further improving Embodiment 1 based on the above research, immediately after commencement of treatment, wet ozone-containing gas holding the required amount of vapor is supplied to the substrate 2 to quickly remove a majority of the photoresist, and as the treatment proceeds, the amount of vapor supplied from the wet ozone-containing gas to the work surface of the substrate 2 is gradually reduced. By adopting this method, Embodiment 15 prevented the excessive supply of vapor to the granular residual film and succeeded in speedily removing the granular residual film. Moreover, depending on the way the granular residual film remained, cases were observed for which it was more effective to supply completely dry ozone-containing gas in the final stages of the treatment. In any case, by gradually reducing the amount of vapor supplied from the wet ozone-containing gas to the work surface of the substrate 2 as the treatment with wet ozone-containing gas proceeds, treatment-time for the granular residual film was shortened, and it was possible to dramatically reduce the time required to completely remove the photoresist.

Figure 19:
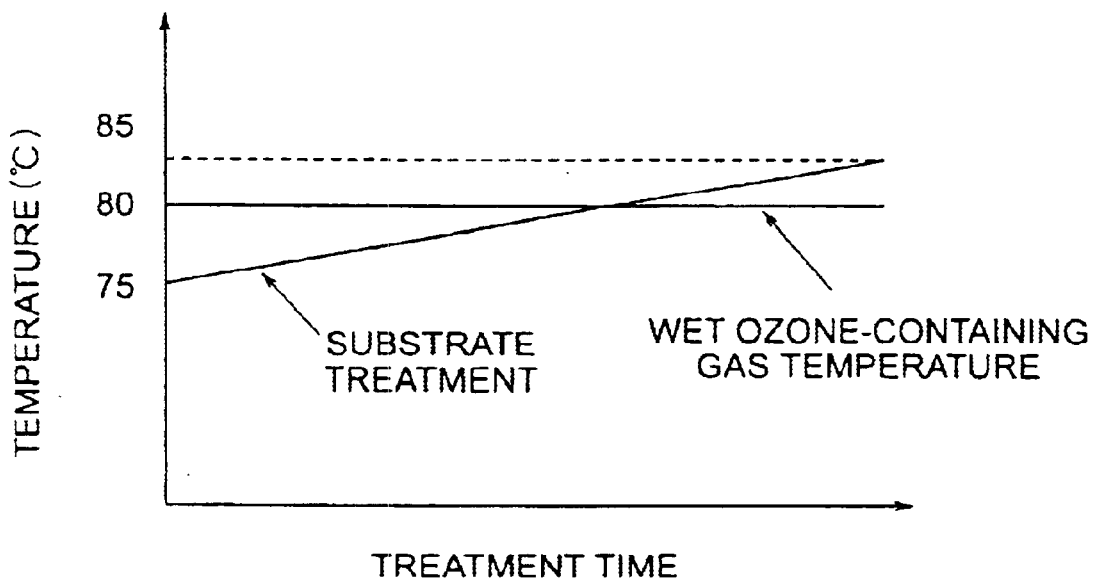
FIG. 19 relates to Embodiment 15 of the present invention and is a graph explaining a relationship between substrate temperature and wet ozone-containing gas temperature.

FIG. 19 is a graph showing the temperature settings for the treatment method for a substrate 2 according to Embodiment 15. As shown in FIG. 19, early in the treatment a suitable temperature difference (approximately 5° C. for example) is established between the substrate 2 and the wet ozone-containing gas, and a suitable amount of vapors is supplied to the substrate 2, that is, enough treatment solution to cover the substrate 2, to rapidly oxidize the photoresist. Because the amount of treatment solution covering the work surface of the substrate 2 increases as the treatment progresses, the temperature of the substrate 2 is raised to control the amount of vapor supplied to the work surface of the substrate 2, that is, the amount of treatment solution covering the substrate 2. In addition, before the treatment enters its final stages and reaches the state in which granular residual film forms, the temperature of the substrate 2 is raised further to control the amount of vapor supplied to the work surface of the substrate 2, that is, the amount of treatment solution covering the work surface of the substrate 2. At the end, the photoresist removal effect is increased if the temperature of the substrate 2 is raised above the temperature of the wet ozone-containing gas (although this depends on the material being removed and on the type of underlayer and is not always necessary).

Figure 20:
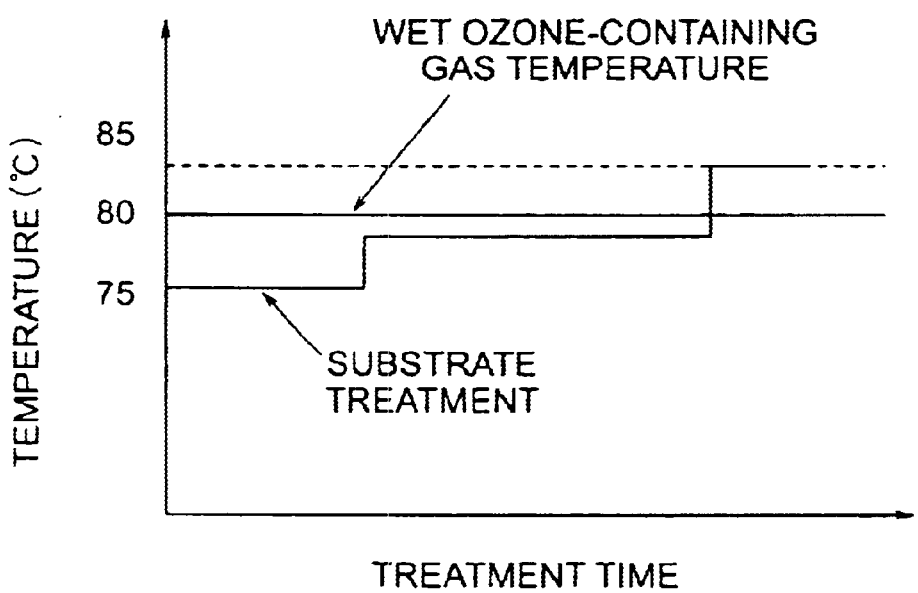
FIG. 20 is a graph explaining the relationship between substrate temperature and wet ozone-containing gas temperature in another example according to Embodiment 15 of the present invention.

The temperature of the substrate 2 does not have to be changed smoothly as the treatment time elapses as in FIG. 19; the same effects can be achieved even if the temperature is changed in steps as in FIG. 20.

Embodiment 16

Embodiment 16 relates to a treatment assembly for large substrates such as LCDs, and the assembly is shown in FIG.

Figure 21:
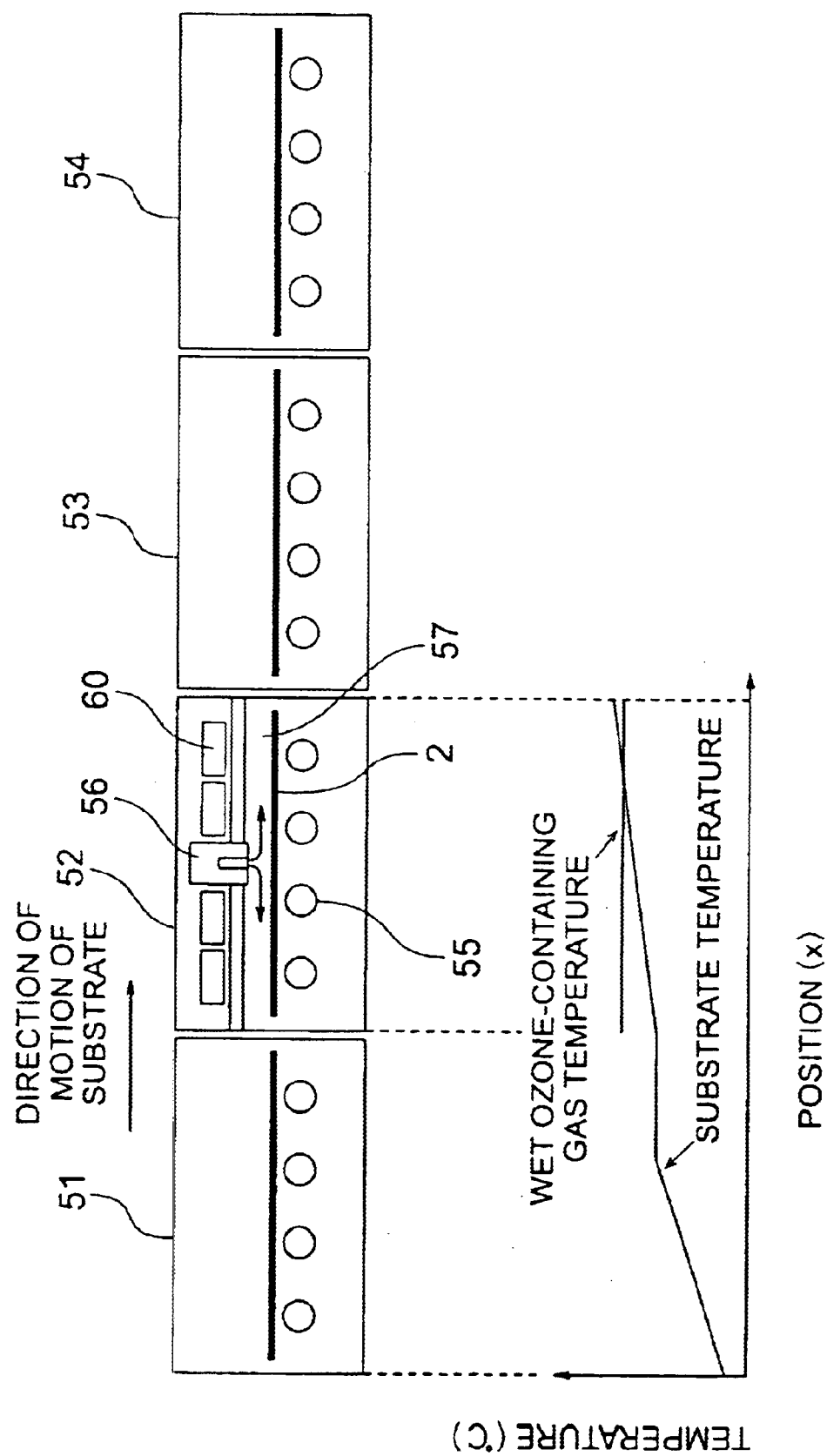
FIG. 21 is a diagram schematically showing a construction of the substrate treatment assembly according to Embodiment 16 of the present invention.

21. In FIG. 21, the substrate treatment assembly is composed of a preheating portion 51 for preheating the substrate 2, an ozone treatment portion 52, a washing portion 53, and a drying portion 54, etc. The substrate 2 is conveyed continuously in one direction through the assembly by rollers 55 and a photoresist film on the work surface of the substrate 2 is removed. Moreover, conveyance may also be performed separately after each type of treatment instead of continuously. The preheating portion 51 is a portion for heating the work substrate 2 in advance. A straight nozzle 56 having a long narrow slit-shaped mouth whose length corresponds to a width dimension of the substrate 2 (i.e., the length in a direction perpendicular to the direction of motion of the substrate 2) is disposed in the ozone treatment portion 52, and a wet ozone-containing gas is sprayed onto the substrate from this slit-shaped nozzle 56 to remove the photoresist on the work surface of the substrate 2. A gas guide 57 is disposed in the ozone treatment portion 52 so that the wet ozone-containing gas sprayed from the nozzle 56 flows in the direction of the arrows and is effectively utilized for the treatment for the substrate. In addition, heaters 60 for heating the substrate 2 are disposed above the gas guide 57.

The temperature of the substrate 2 is controlled as shown in the lower part of FIG. 21 by adjusting the set temperatures of each of the heaters 60. Moreover, in FIGS. 19 and 20, the x-axis (lateral axis) represented treatment time, but in a line assembly such as shown in FIG. 21, position x can be substituted as a function thereof. In other words, if v is the conveyance speed of the substrate 2, then the relationship between treatment time t and position x can be expressed by x=vt. As shown in the diagram, it was possible to completely remove the photoresist over the entire surface in less than half the time taken when the substrate 2 was treated at a constant temperature.

Embodiment 17

Figure 22:
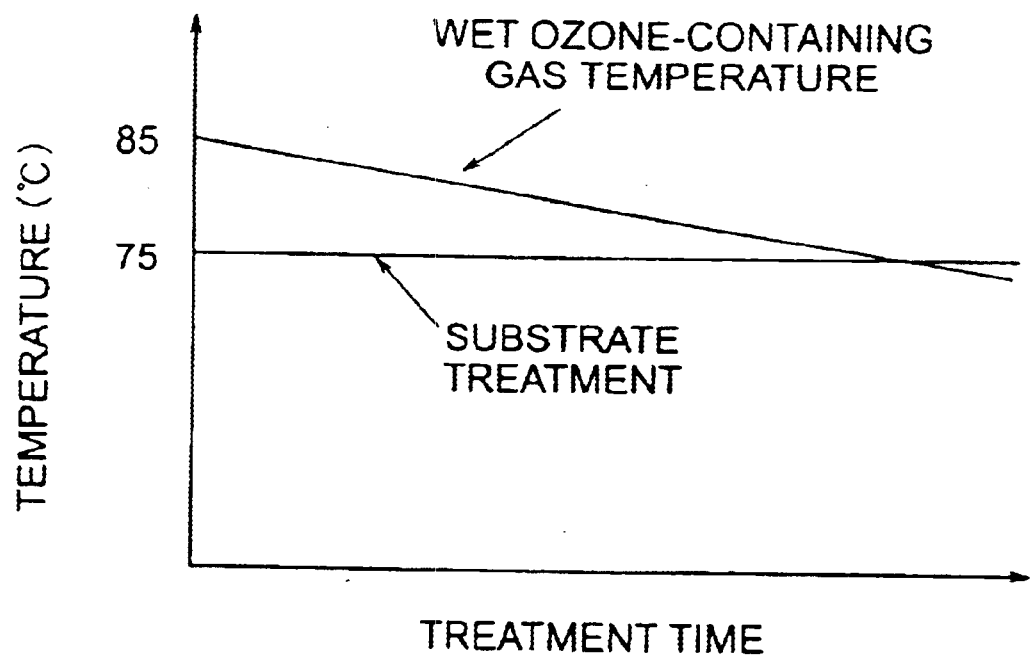
FIG. 22 relates to Embodiment 17 of the present invention and is a graph explaining a relationship between substrate temperature and wet ozone-containing gas temperature.

In Embodiments 15 and 16, the temperature of the substrate 2 was raised as the treatment progressed, but in Embodiment 17, the amount of vapor contained in the wet ozone-containing gas is reduced by lowering the temperature of the wet ozone-containing gas as the treatment progresses while keeping the temperature of the substrate constant, thereby reducing the amount of vapor supplied to the work surface of the substrate 2, that is, the amount of treatment solution covering the work surface of the substrate 2. The temperature setting relationship of the present embodiment is shown in FIG. 22. The x-axis (lateral axis) represents treatment time, and the y-axis (vertical axis) represents the temperatures of both the substrate 2 and the wet ozone-containing gas. As shown in FIG. 22, early in the treatment a suitable temperature difference (approximately 10° C. for example) is established between the substrate 2 and the wet ozone-containing gas to rapidly oxidize the photoresist at a suitable humidity. Because the amount of treatment solution covering the work surface of the substrate 2 increases as the treatment progresses, the temperature of the wet ozone-containing gas is lowered to control the accompanying amount of vapor. In addition, before the treatment enters its final stages and reaches the state in which granular residual film forms, the temperature of the wet ozone-containing gas is lowered further to control the amount of vapor supplied. The basic principle is the same as that of Embodiment 15.

Embodiment 18

Figure 23:
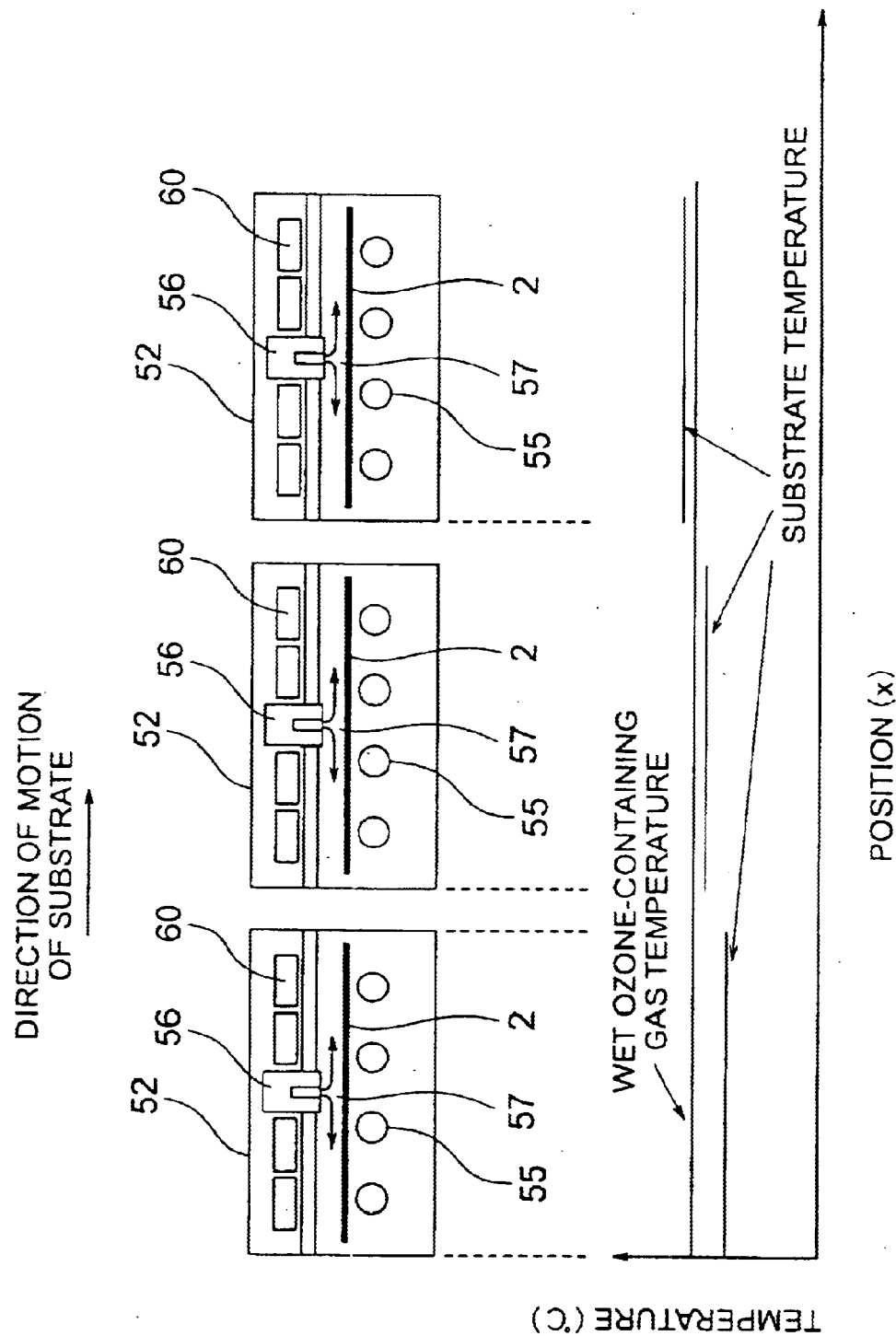
FIG. 23 is a diagram schematically showing a construction of the substrate treatment assembly according to Embodiment 18 of the present invention.

The theory of Embodiment 18 is basically the same as that of Embodiment 16 above, but as shown in FIG. 23, counter measures to granular residual film are made possible by using a number of ozone treatment portions 52, changing the temperature of the substrate in stages in each ozone treatment portion 52, and setting the temperature of the substrate 2 higher in the ozone treatment portions 52 in successive stages. In this case, since resist components which have been reduced to a low molecular weight accumulate in the treatment solution, it is preferable to introduce a washing process after each of the successive ozone treatment portions 52.

Embodiment 19

Figure 24:
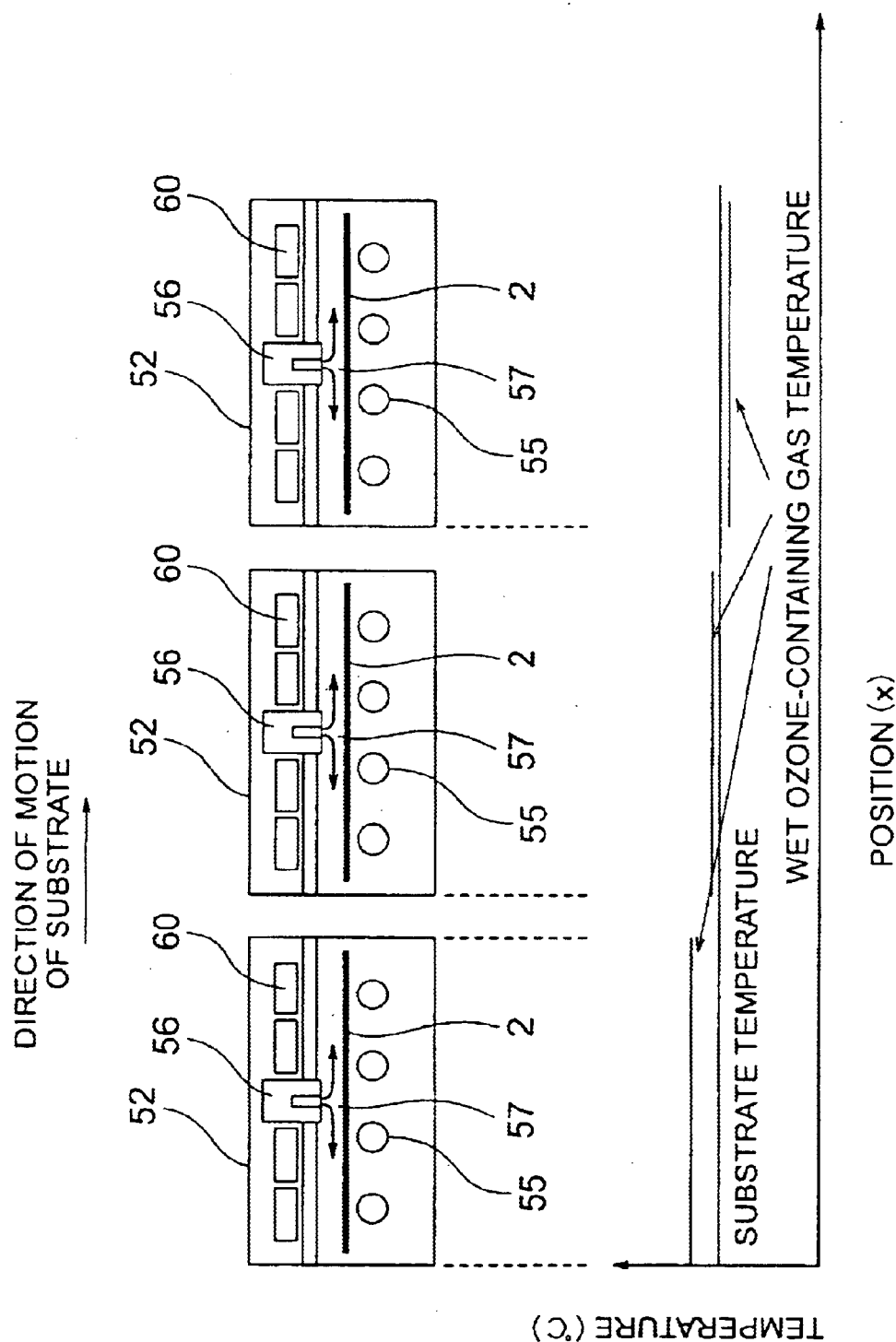
FIG. 24 is a diagram schematically showing a construction of the substrate treatment assembly according to Embodiment 19 of the present invention.

The theory of Embodiment 19 is basically the same as that of Embodiment 17 above, but as shown in FIG. 24, the same effects as in Embodiment 18 above can be achieved by using a number of ozone treatment portions 52 and setting the temperature of the wet ozone-containing gas lower in the later stages. In this case, resist removal performance is sometimes better if dry gas is supplied in the final stage ozone treatment portion 52 instead of supplying wet gas.

Embodiment 20

Figure 25:
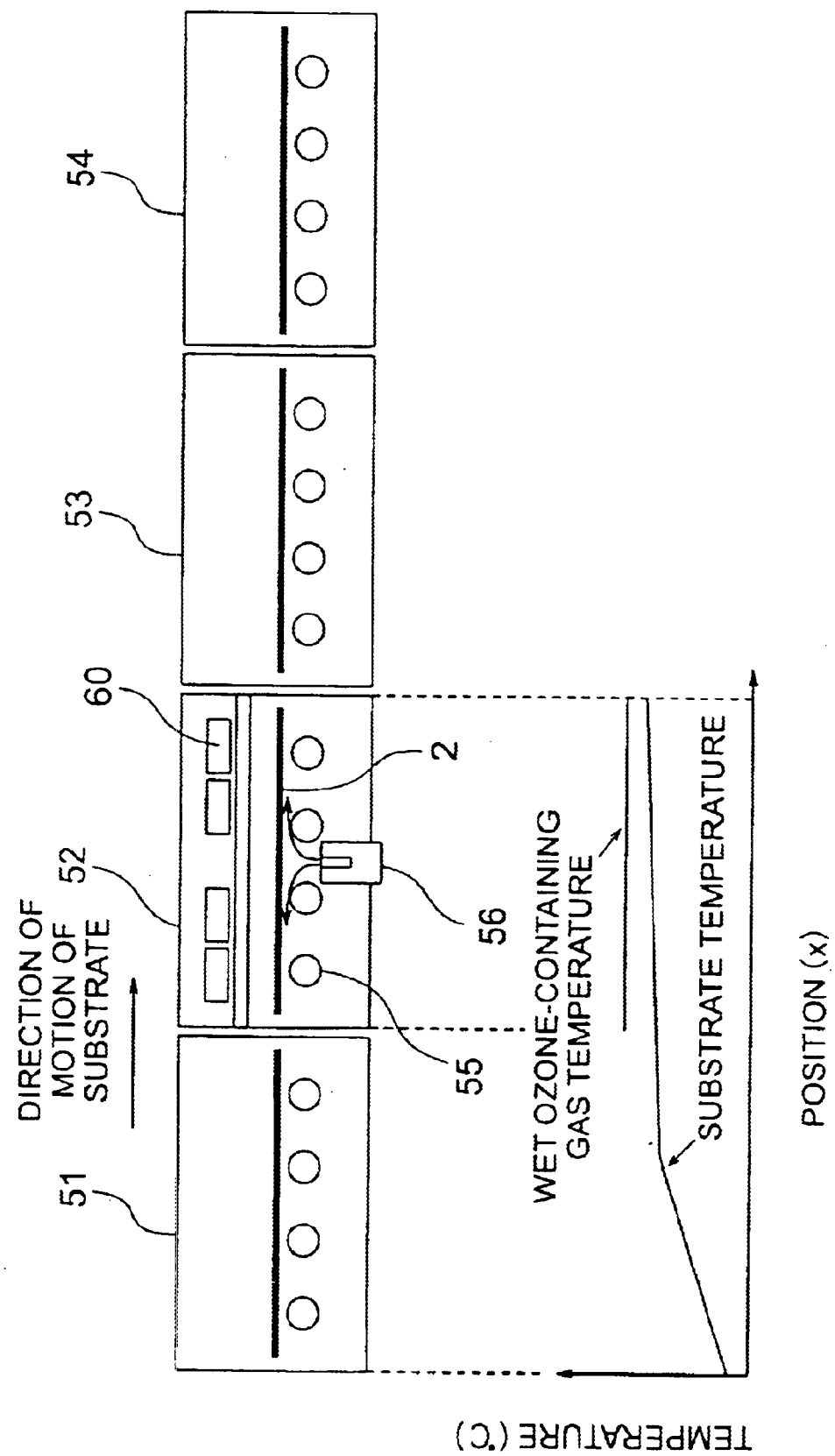
FIG. 25 is a diagram schematically showing a construction of the substrate treatment assembly according to Embodiment 20 of the present invention.

In each of the above Embodiments 1 to 19, the work surface of the work substrate 2 was set facing upwards in the ozone treatment portions 52 and the wet ozone-containing gas was sprayed from above the work surface, but in Embodiment 20, the work surface is set facing downwards as shown in FIG. 25 and the wet ozone-containing gas is sprayed onto the substrate 2 from below. Because the solution beads 34 shown in FIG. 18 are less likely to form if this is done, the temperature control range for the substrate 2 and the wet ozone-containing gas can be widened, enabling an inexpensive assembly to be provided.

Embodiment 21

The fundamental concept of the present invention lies in the discovery of the importance of making the film thickness of the treatment solution thin enough in the removal of organics, etc., using ozone gas not to obstruct the supply of ozone gas to the photoresist by including the minimum amount of treatment solution required to dissolve organic acids. Concrete examples of methods involving the use of wet ozone-containing gas having an increased saturated vapor level have been explained above; but in Embodiment 21 another method will be disclosed.

Figure 26:
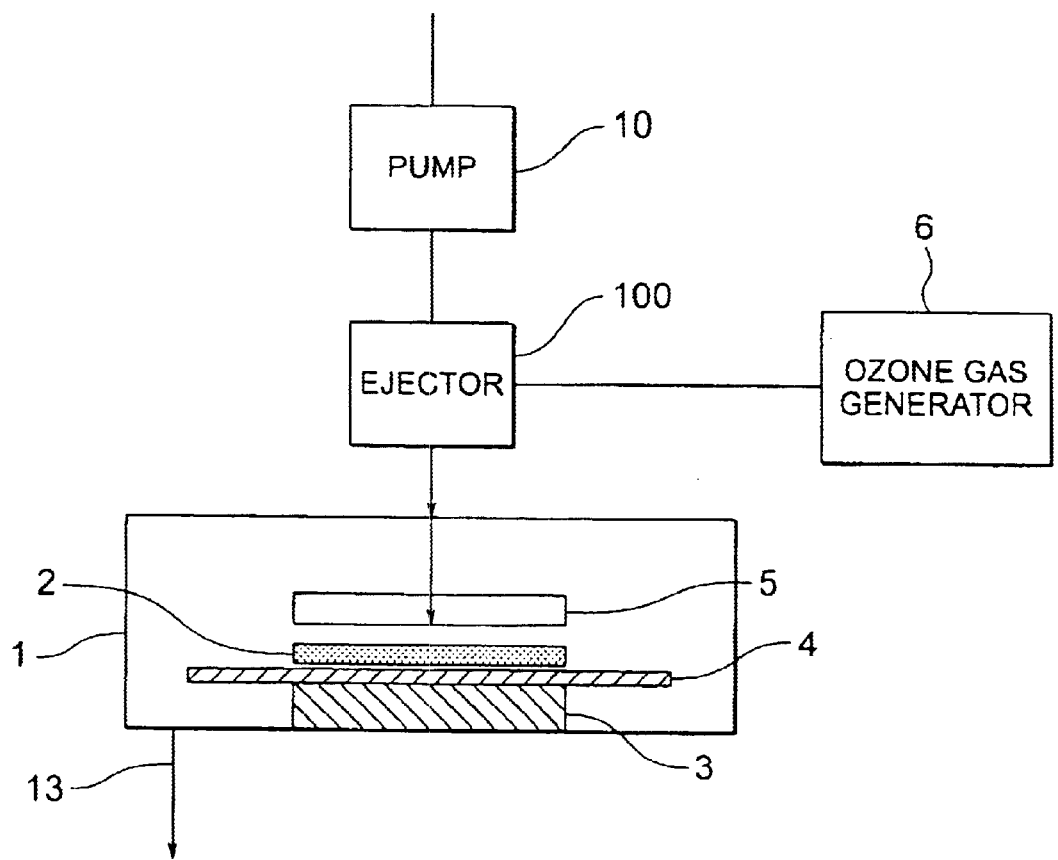
FIG. 26 is a diagram showing part of a construction of the substrate treatment assembly according to Embodiment 21 of the present invention.
Figure 27:
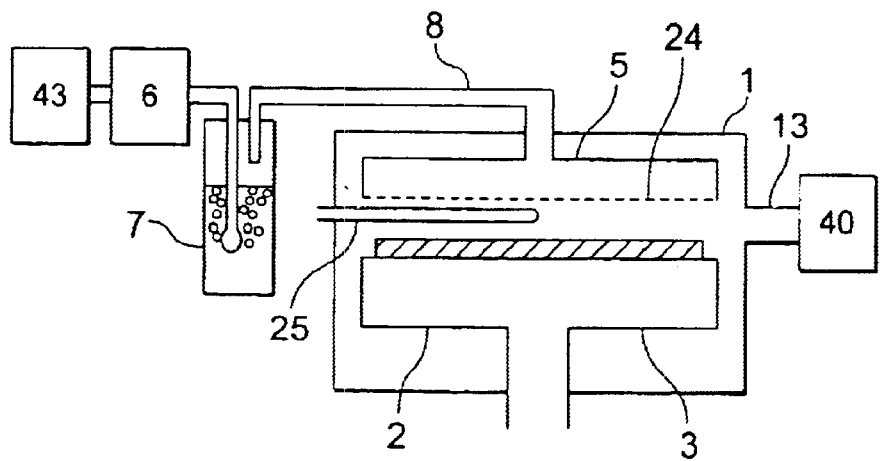
FIG. 27 is a diagram showing the construction of a conventional substrate treatment assembly using, wet ozone.

FIG. 26 is a diagram showing part of a construction of the substrate treatment assembly according to Embodiment 21 of the present invention. The assembly according to the present embodiment is equipped with a base table 3 for securing a substrate 2 inside a treatment room 1 which is a seated space, and a treatment agent supply plate, i.e., a header 5, disposed facing the base table 3. The treatment agent may be the ozone-containing gas, or the treatment solution, or a combination of both. A number of treatment agent supply apertures are disposed in the header 5, and ozone-containing gas and treatment solution (photoresist film removal solution) is supplied to a work surface of a substrate 2 through these apertures. Spacing between the header 5 and the substrate 2 is between 0.1 mm and 1.0 mm.

In FIG. 26, the construction is such that the ozone-containing gas and the treatment solution are mixed in an ejector 100 before being introduced into the header 5, but the ozone-containing gas and the treatment solution may be introduced into the header 5 separately, or they may even be supplied directly to the work surface of the substrate 2 through separate supply apertures.

Before explaining the photoresist film removal process using the assembly according to the present embodiment shown in FIG. 26, the photoresist film removal process using a generic substrate treatment assembly of the type in which the substrate is rotated will be explained here. First, the substrate is secured to a substrate stage and the substrate is rotated at a predetermined rotational frequency. Next, the ozone-containing gas and the treatment solution are supplied from the header so as to be directed at the substrate. Then, the photoresist film on the substrate reacts with the ozone, oxidizing and decomposing the photoresist film, and the photoresist film is also hydrolyzed by reaction with the moisture in the treatment solution, reducing the molecular weight of the photoresist film. The reduced photoresist film is dissolved in the treatment solution and is removed from the substrate surface together with the treatment solution.

Consequently, as disclosed in Embodiment 12, the treatment solution can be selected from a group including: pure water and ultrapure water; acidic aqueous solutions of sulfuric acid, hydrochloric acid, nitric acid, acetic acid, hydrogen peroxide, or the like; alkaline aqueous solutions of ammonium hydroxide or the like; organic solvents including ketones such as acetone and alcohols such as isopropanol; and mixtures of the above. As explained previously, in the semiconductor manufacturing process in particular, it is useful to add minute quantities of chemicals such as the above acidic aqueous solutions, alkaline aqueous solutions, ketones, alcohols, or the like to remove residues which have caked after etching or where ions have been doped in high concentration ($10^5/cm^2$, for example), etc.

In order to rapidly remove photoresist film, it is desirable for the ozone-containing gas to be supplied continuously and for the treatment solution to be supplied intermittently. The reason for this is that if the treatment solution is supplied continuously, the surface of the photoresist film becomes covered by a film of the treatment solution, making it difficult for the ozone to reach the surface of the photoresist film, thereby reducing the photoresist removal speed. In contrast, if the treatment solution is supplied intermittently, photoresist film removal solution is removed from the surface of the photoresist film by the rotation of the substrate and the gas flow, enabling the ozone to reach the surface of the photoresist film and react efficiently.

On the other hand, when the amount of supply and the frequency of supply of the photoresist film removal solution is low, the surface of the photoresist film becomes dry, and the photoresist film removal speed drops because there is insufficient moisture for hydrolysis and insufficient photoresist film removal solution to dissolve the reduced photoresist components after reaction with the ozone.

Consequently, in order to remove the photoresist film quickly, it is necessary to supply an optimal amount of photoresist film removal solution to the top of the photoresist film.

Furthermore, in order to improve the photoresist film removal speed, it is necessary to supply the amount of photoresist film removal solution required for hydrolysis and dissolution of the photoresist film and to supply ozone to the surface of the photoresist film efficiently. However, in order to fulfill these conditions, a large number of parameters including the flow rate of the ozone-containing gas, the rotational frequency, the frequency of supply of the treatment solution, and the amount of supply of the treatment solution, must be optimized. Furthermore, when trying to remove the photoresist film quickly and uniformly, because the substrate is rotating, centrifugal force is greater at positions towards the radial outside of the substrate, making the dwell time of the treatment solution at those positions shorter. For that reason, it is necessary to arrange the treatment solution supply apertures radially, and to adjust their flow rates.

In the present Embodiment 21, in answer to these problems, the number of parameters to be optimized is reduced by narrowing the spacing between the substrate 2 and the header 5 which supplies the treatment agent to between 0.1 mm and 1.0 mm. That is, when the spacing between the substrate 2 and the header 5 is made extremely narrow, as it is between 0.1 mm and 1.0 mm, because the passage for the ozone-containing gas and the treatment solution formed between the substrate 2 and the header 5 becomes narrow, the treatment solution is pushed towards the outside of the substrate 2 by the ozone-containing gas. For that reason, the treatment solution does not form a film on the surface of the photoresist film and the ozone-containing gas can efficiently contact the surface of the photoresist. Thus, because the treatment solution is pushed towards the outside of the substrate 2 by the ozone-containing gas, it is not necessary to rotate the substrate 2 and the ozone-containing gas and the treatment solution can be supplied continuously. Consequently, the parameters required for improving the photoresist film removal speed are reduced in number to the spacing between the substrate 2 and the header 5, the flow rate of the ozone-containing gas, and the flow rate of the treatment solution.

When the spacing between the substrate 2 and the header 5 is greater than 1 mm, the number of ozone molecules discharged from the system without contacting the surface of the photoresist film increased, but by narrowing the spacing between the substrate 2 and the header 5 to between 0.1 mm and 1.0 mm, the probability of the ozone molecules contacting the photoresist film increased, enabling the ozone-containing gas to be react efficiently.

Moreover, it is preferable for the photoresist removal treatment according to the present embodiment to be performed with the temperature of the substrate 2 and the treatment solution higher than room temperature, and in that case, the treatment speed is improved further.

Embodiment 22

Embodiments 1 to 21 above have been explained only with reference to photoresist film removal, but the present invention relates basically to substrate treatment using ozone, namely, oxidation reaction control using ozone, and is effective in the decomposition of organics in the main. The present Embodiment 22 is an application to such a field outside photoresist film removal. Examples of such applications include cleaning of semiconductor substrates and liquid crystal substrates, de-smearing of printed circuit boards, cleaning of printed wiring boards, degreasing and cleaning of precision parts, etc. In addition, these methods are also effective in fields related to oxidation of metals and fields conventionally using metal-containing chemicals such as blackening of printed wiring boards, etc.

An example of such a field of application will now be explained in further detail. In multiplayer build-up substrates which are used in a wide variety of fields including cellular phones and the like, the "laser via method" is often used to form continuity eyelets for electrically connecting upper and lower layers by opening vias using a laser, and applying electroless deposition. However, in the via opening process, organics from the parent material (glass-epoxy, etc.) have been a big problem because they may remain in the vias, reducing the adhesive strength of the deposition and in the worst cases blocking the continuity between layers. The remnants of these organics are referred to as "smear" and the process of removing them is called "de-smearing".

Conventionally, de-smearing is generally performed using chemicals which have a large environmental impact such as sodium permanganate. However, ozone is viewed as a promising alternative process because sodium permanganate is difficult to treat as waste and because the viscosity of permanganic acid is high, making it difficult to de-smear vias with a small diameter.

Inventive Example 7

The present embodiment will now be explained further using an inventive example. In Inventive Example 7, a treatment similar to that described in Embodiment 1 was applied to the abovementioned de-smearing process. More specifically, the substrate temperature was set at 60° C. and wet ozone-containing gas at a temperature approximately 20° C. higher than the substrate temperature was sprayed onto the substrate. These conditions were found to achieve de-smearing at the fastest speed. In the photoresist removal processes above, a temperature difference of 10° C. or more between the substrate and the ozone-containing gas was found to be optimal but in the case of de-smearing an even larger temperature difference was found to be suitable. This is thought most likely to be due to swelling effects as the moisture enters the glass-epoxy substrate. Moreover, hardly any de-smearing was possible when dry ozone gas, as opposed to wet ozone gas, was sprayed onto the substrate.

De-smearing of small-diameter vias was possible, and by blowing on the wet ozone-containing gas at high speed using a nozzle, it was even possible to de-smear the bottoms of vias having a diameter of 50 μm and a depth of 100 μm. It is significant that, using wet ozone-containing gas in this manner, de-smearing can be achieved in regions which were not possible with conventional solutions, namely, small-diameter high-aspect ratio vias.

As explained above, according to one aspect of the present invention, there is provided a substrate treatment method including a wet ozone-containing gas treatment process for treating a work object on a surface of a substrate by supplying to the work object a wet ozone-containing gas wetted with a treatment solution, the wet ozone-containing gas contains more vapor of the treatment solution than a saturation vapor level occurring at a given temperature of the substrate, whereby an amount of moisture suitable for reaction can be supplied to the substrate, enabling the substrate treatment speed to be improved.

The wet ozone-containing gas treatment process may include:

maintaining the substrate at a temperature higher than room temperature; and controlling the wet ozone-containing gas so as to be at a temperature approximately equal to or greater than the temperature of the substrate, whereby reaction temperature is raised and an amount of moisture suitable for reaction can be supplied to the substrate, enabling the substrate treatment speed to be improved.

The temperature of the wet ozone-containing gas may be controlled so as to be between 5° C. and 15° C. higher than the temperature of the substrate, enabling the substrate treatment speed to be further increased.

A cleaning process may be included after the wet ozone-containing gas treatment process, the cleaning process including cleaning the substrate with a cleaning solution containing at least one organic solvent chosen from a group including pure water, acidic aqueous solutions, alkaline aqueous solutions, ketones, and alcohols, enabling the substrate treatment speed to be further increased.

The cleaning solution may be at a temperature higher than room temperature, enabling the substrate treatment speed to be further increased.

The wet ozone-containing gas treatment process and the cleaning process may be repeated a number of times, enabling the substrate treatment speed to be further increased.

A pretreatment process may also be included before the wet ozone-containing gas treatment process, the pretreatment process including irradiating the work object on the surface of the substrate with ultraviolet light having a wavelength of 300 nm or more, whereby there may be azide radicals present at the edges of a photoresist, for example, but by irradiating the azide radicals with ultraviolet light having a wavelength of 300 nm or more, the azide radicals are decomposed, achieving a reduced ozone consumption rate and increased treatment speed.

The wet ozone-containing gas may be irradiated with ultraviolet light having a wavelength in a vicinity of 250 nm during the wet ozone-containing gas treatment process, whereby the ultraviolet light having a wavelength in the vicinity of 250 nm decomposes the ozone and generates oxygen radicals which have even more intense oxidation strength than ozone, these oxygen radicals having the effect of enabling the substrate treatment speed to be improved and the concentration of ozone in the exhaust gas to be lowered.

The wet ozone-containing gas treatment process may include reducing the amount of vapor supplied to the work object on the surface of the substrate by the wet ozone-containing gas as treatment time elapses, whereby the photoresist is prevented from remaining in granule form, enabling the substrate treatment speed to be improved.

The wet ozone-containing gas treatment process may include reducing the amount of vapor supplied to the work object on the surface of the substrate by the wet ozone-containing gas by raising the temperature of the substrate as treatment time elapses, whereby the photoresist is prevented from remaining in granule form, enabling the substrate treatment speed to be improved.

The wet ozone-containing gas treatment process may be performed in a number of treatment tanks and may include setting the temperature of the substrate so as to be progressively higher in each successive treatment tank, whereby the photoresist is prevented from remaining in granule form, enabling the substrate treatment speed to be improved.

The wet ozone-containing gas treatment process may include reducing the amount of vapor supplied to the work object on the surface of the substrate by the wet ozone-containing gas by lowering the temperature of the wet ozone-containing gas as treatment time elapses, whereby the photoresist is prevented from remaining in granule form, enabling the substrate treatment speed to be improved.

The wet ozone-containing gas treatment process may be performed in a number of treatment tanks and may include setting the temperature of the wet ozone-containing gas so as to be progressively lower in each successive treatment tank, whereby the photoresist is prevented from remaining in granule form, enabling the substrate treatment speed to be improved.

According to yet another aspect of the present invention, there is provided a substrate treatment assembly including:

a substrate heating device for maintaining a substrate at a temperature higher than room temperature:

a wetting device for obtaining a wet ozone-containing gas by wetting an ozone-containing gas with a treatment solution;

a supply device for supplying the wet ozone-containing gas to a work object on a surface of the substrate;

a gas conduit connecting the wetting device to the supply device; and a wet ozone-containing gas heating device for heating the wet ozone-containing gas so as to be at a temperature approximately equal to or greater than the temperature of the substrate, whereby reaction temperature is raised and an amount of moisture suitable for reaction can be supplied to the substrate, enabling the substrate treatment speed to be improved.

The supply device may include a gas disperser including a number of apertures aligned in a number of rows in a width direction of the work object, the disperser being constructed such that apertures in adjacent rows do not align with each other in a direction perpendicular to the rows, the supply device being constructed such that at least the gas disperser or the substrate is movable in a direction perpendicular to the rows, making it possible to treat the substrate without lowering treatment efficiency using an aperture-type gas disperser which can be prepared inexpensively and with high precision.

Spacing between adjacent aperture rows of apertures in the gas disperser may be 5 mm or more, enabling substrate treatment efficiency to be further improved.

According to yet another aspect of the present invention, there is provided a substrate treatment assembly for supplying an ozone-containing gas and a treatment solution to a work object on a surface of a substrate through a treatment agent supply plate disposed facing the work object, in which spacing between a surface of the work object and the treatment agent supply plate is between 0.1 mm and 1.0 mm, whereby an amount of moisture suitable for reaction can be supplied to the substrate without a rotating mechanism or the like for controlling the amount of moisture on the substrate, thereby enabling the substrate treatment speed to be improved by an extremely inexpensive device.

What is claimed is:

1. A substrate treatment method comprising:

treating a work object on a surface of a substrate at a temperature by supplying to the work object a wet ozone-containing gas wetted with a treatment solution, wherein the wet ozone-containing gas contains a concentration of vapor of the treatment solution larger than a saturation vapor level of the treatment solution at the temperature of the substrate; and controlling the temperature of the wet ozone-containing gas to be between 5° C. and 15° C. higher than the temperature of the substrate.

2. A substrate treatment method comprising:

maintaining a substrate having a work object on a surface of the substrate at a temperature higher than room temperature; and treating the work object on the surface of the substrate by supplying to the work object a wet ozone-containing gas wetted with a treatment solution, wherein the wet ozone-containing gas contains a concentration of vapor of the treatment solution larger than a saturation vapor level of the treatment solution at the temperature of the substrate, including controlling the temperature of the wet ozone-containing gas to be between 5° C. and 15° C. higher than the temperature of the substrate.

3. A substrate treatment method comprising:

treating a work object on a surface of a substrate at a temperature by supplying to the work object a wet ozone-containing gas wetted with a treatment solution, wherein the wet ozone-containing gas contains a concentration of vapor of the treatment solution larger than a saturation vapor level of the treatment solution at the temperature of the substrate; and after treating the work object with the wet ozone-containing gas, cleaning the substrate with a cleaning solution containing at least one solvent chosen from the group consisting of pure water, acidic aqueous solutions, alkaline aqueous solutions, ketones, and alcohols.

4. The substrate treatment method according to claim 3 wherein the cleaning solution is at a temperature higher than room temperature.

5. The substrate treatment method according to claim 3 including repeating the treating of work object with the wet ozone-containing gas and cleaning.

6. The substrate treatment method according to claim 2 comprising, after treating the work object with the wet ozone-containing gas, cleaning the substrate with a cleaning solution containing at least one solvent chosen from the group consisting of pure water, acidic aqueous solutions, alkaline aqueous solutions, ketones, and alcohols.

7. A substrate treatment method further comprising:

treating a work object on a surface of a substrate at a temperature by supplying to the work object a wet ozone-containing gas wetted with a treatment solution, wherein the wet ozone-containing gas contains a concentration of vapor of the treatment solution larger than a saturation vapor level of the treatment solution at the temperature of the substrate; and before treating the work object with the wet ozone-containing gas, irradiating the work object on the surface of the substrate with ultraviolet light having a wavelength of at least 300 nm.

8. A substrate treatment method comprising:

treating a work object on a surface of a substrate at a temperature by supplying to the work object a wet ozone-containing gas wetted with a treatment solution, wherein the wet ozone-containing gas contains a concentration of vapor of the treatment solution larger than a saturation vapor level of the treatment solution at the temperature of the substrate; and while treating the work object on the surface of the substrate, reducing the amount of the treatment solution on the surface of the substrate, as treatment time elapses, by changing the temperature of one of the substrate and the wet ozone-containing gas.

9. The substrate treatment method according to claim 8 including reducing the amount of the treatment solution on the surface of the substrate by raising the temperature of the substrate as treatment time elapses.

10. The substrate treatment method according to claim 9 including treating with the wet ozone-containing gas successively in a plurality of treatment tanks and setting the temperature of the substrate to be progressively higher in each successive treatment tank.

11. The substrate treatment method according to claim 8 comprising, while keeping the temperature of the substrate constant, reducing the amount of the treatment solution on the surface of the substrate by lowering the temperature of the wet ozone-containing gas as treatment time elapses.

12. The substrate treatment method according to claim 11 including treating with the wet ozone-containing gas successively in a plurality of treatment tanks and setting the temperature of the wet ozone-containing gas to be progressively lower in each successive treatment tank.

* * * * *